(12) United States Patent
Kerber et al.

(10) Patent No.: US 9,275,908 B2
(45) Date of Patent: Mar. 1, 2016

(54) SEMICONDUCTOR DEVICE INCLUDING GATE CHANNEL HAVING ADJUSTED THRESHOLD VOLTAGE

(71) Applicant: International Business Machines Corporation, Armonk, NY (US)

(72) Inventors: Pranita Kerber, Mount Kisco, NY (US); Qiqing C. Ouyang, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/729,105

(22) Filed: Jun. 3, 2015

(65) Prior Publication Data
US 2015/0318218 A1 Nov. 5, 2015

Related U.S. Application Data

(62) Division of application No. 14/265,735, filed on Apr. 30, 2014.

(51) Int. Cl.
| | |
|---|---|
| *H01L 21/8234* | (2006.01) |
| *H01L 21/8238* | (2006.01) |
| *H01L 27/092* | (2006.01) |
| *H01L 21/02* | (2006.01) |
| *H01L 29/66* | (2006.01) |
| *H01L 21/306* | (2006.01) |

(52) U.S. Cl.
CPC .. *H01L 21/823821* (2013.01); *H01L 21/02532* (2013.01); *H01L 21/30604* (2013.01); *H01L 21/823807* (2013.01); *H01L 21/823828* (2013.01); *H01L 27/0922* (2013.01); *H01L 29/6681* (2013.01)

(58) Field of Classification Search
CPC .................. H01L 29/785; H01L 29/66795
See application file for complete search history.

(56) References Cited

U.S. PATENT DOCUMENTS

| | | | |
|---|---|---|---|
| 7,238,989 B2 | 7/2007 | Yeo et al. | |
| 8,450,165 B2 | 5/2013 | Bohr | |
| 2007/0032020 A1* | 2/2007 | Grebs et al. | 438/272 |

(Continued)

FOREIGN PATENT DOCUMENTS

| | | |
|---|---|---|
| WO | 2012074872 A2 | 6/2012 |
| WO | 2013095651 A1 | 6/2013 |

OTHER PUBLICATIONS

Choi et al., "Sub-20 nm CMOS FinFET technologies," Electron Devices Meeting, 2001. IEDM '01. Technical Digest. International.

(Continued)

*Primary Examiner* — Mounir Amer
(74) *Attorney, Agent, or Firm* — Cantor Colburn LLP; Daniel Morris

(57) ABSTRACT

A semiconductor device includes at least one first semiconductor fin formed on an nFET region of a semiconductor device and at least one second semiconductor fin formed on a pFET region. The at least one first semiconductor fin has an nFET channel region interposed between a pair of nFET source/drain regions. The at least one second semiconductor fin has a pFET channel region interposed between a pair of pFET source/drain regions. The an epitaxial liner is formed on only the pFET channel region of the at least one second semiconductor fin such that a first threshold voltage of the nFET channel region is different than a second threshold voltage of the pFET channel.

13 Claims, 26 Drawing Sheets

(56) References Cited

U.S. PATENT DOCUMENTS

| | | | |
|---|---|---|---|
| 2007/0090416 A1 | 4/2007 | Doyle et al. | |
| 2011/0024804 A1 | 2/2011 | Chang et al. | |
| 2012/0319211 A1* | 12/2012 | van Dal et al. | 257/401 |
| 2014/0145242 A1* | 5/2014 | Huang et al. | 257/192 |
| 2015/0008490 A1* | 1/2015 | Strain et al. | 257/288 |

OTHER PUBLICATIONS

Monfray et al., "Applications of SiGe Material for CMOS and Related Processing." Bipolar/BiCMOS Circuits and Technology Meeting, IEEE, 2006.

Seger, "Interaction of Ni with SiGe for electrical contacts in CMOS technology", A dissertation submitted to the Royal Institute of Technology, Stockholm, Sweden in partial fulfillment of the requirements for the degree of Doctor of Philosophy (Ph. D.), 2005.

Togo et al., "Phosphorus doped SiC Source Drain and SiGe channel for scaled bulk FinFETs," Electron Devices Meeting (IEDM), 2012 IEEE International.

Toh et al., "Impact Ionization Nanowire Transistor with Multiple-Gates, Silicon—Germanium Impact Ionization Region, and Sub-5 mV/decade Subtheshold Swing," Electron Devices Meeting, 2007. IEDM 2007. IEEE International.

* cited by examiner

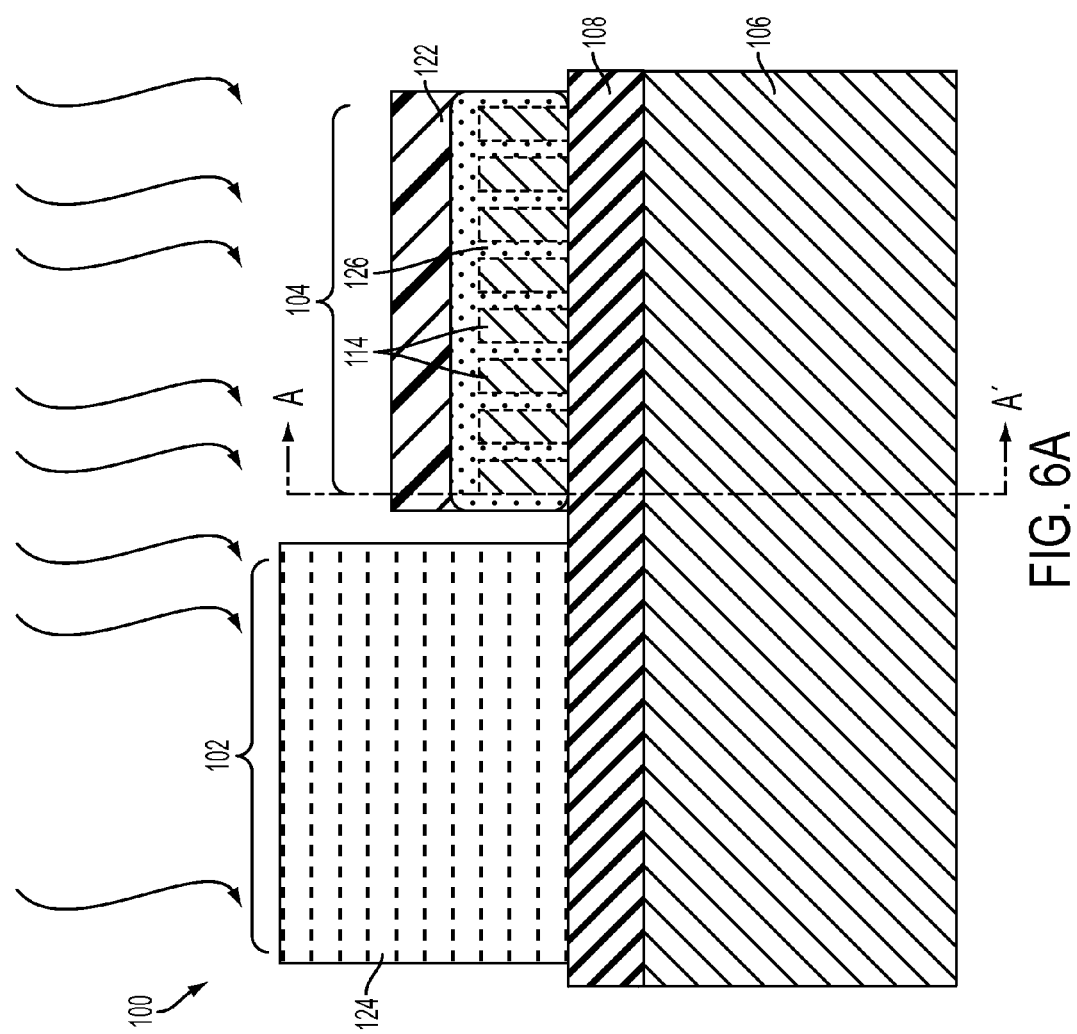

SEMICONDUCTOR DEVICE INCLUDING GATE CHANNEL HAVING ADJUSTED THRESHOLD VOLTAGE

DOMESTIC PRIORITY

This application is a continuation of U.S. patent application Ser. No. 14/265,735, filed Apr. 30, 2014, the disclosure of which is incorporated by reference herein in its entirety.

BACKGROUND

The present invention relates generally to semiconductor devices, and more specifically, to a semiconductor device including a gate channel having an adjusted threshold voltage.

Semiconductor devices, such as complimentary metal gate oxide semiconductor (CMOS) devices for example, include silicon germanium (SiGe) to adjust the threshold voltage (Vt). Regarding planar devices, the SiGe channel is epitaxially grown on the bulk or SOI silicon substrate and is patterned during gate or spacer definition. The junctions are then typically formed using in-situ doped SiGe in source/drain (S/D) and extension regions. Implanting a p-type dopant (e.g., boron) in the epitaxially grown SiGe results in very low diffusion of the species and leads to under lapped high-resistance extension regions. With respect to trigate/finFET devices, epitaxially growing SiGe entirely on the Si fins, including on upper surfaces of the fins in the S/D regions, leaves the entire core of the Si fins relatively undoped and results in high-access resistance.

SUMMARY

According to at least one embodiment, a method of forming a semiconductor device includes forming at least one first semiconductor fin on an nFET region of a semiconductor device and at least one second semiconductor fin on a pFET region of the semiconductor device. The at least one first semiconductor fin has an nFET channel region interposed between a pair of nFET source/drain regions. The at least one second semiconductor fin has a pFET channel region interposed between a pair of pFET source/drain regions. The method further includes forming an epitaxial liner on only the pFET channel region of the at least one second semiconductor fin such that a first threshold voltage of the nFET channel region is different than a second threshold voltage of the pFET channel.

According to another exemplary embodiment, a semiconductor device comprises a semiconductor substrate including an nFET region and a pFET region separately located from the nFET region. At least one first semiconductor fin is formed on the nFET region. The at least one first semiconductor fin has an nFET channel region interposed between a pair of nFET source/drain regions. At least one second semiconductor fin is formed on the pFET region. The at least one second semiconductor fin has a pFET channel region interposed between a pair of pFET source/drain regions. The semiconductor device further includes an epitaxial liner formed only on the pFET channel region such that a first threshold voltage of the nFET channel region is different than a second threshold voltage of the pFET channel.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. FIGS. 1-14 are a series of views illustrating a method of forming a finFET device according to embodiments of the disclosure, in which:

FIG. 1 is a cross-sectional view in a first orientation illustrating a semiconductor-on-insulator (SOI) starting substrate according to an exemplary embodiment;

FIG. 2 illustrates the substrate of FIG. 1 after patterning an active semiconductor layer to form a plurality of semiconductor fins on an insulator layer;

FIG. 6A illustrates the substrate of FIGS. 4A-4B in the first orientation after selectively growing a first epitaxial material on the semiconductor fins formed in a pFET region of the substrate and annealing the substrate to diffuse ions of the epitaxial material into the fin to form diffused extension regions according to a second embodiment;

FIG. 12 illustrates the substrate of FIGS. 11A-11C in the second orientation following formation of a metal gate stack that wraps around the epi-lined channel region; and FIG. 13 illustrates the substrate of FIG. 12 in the second orientation following formation of contact structures in the source/drain regions.

FIG. 14 is a flow diagram illustrating a method of fabricating a semiconductor device according to an exemplary embodiment.

DETAILED DESCRIPTION

Figure 1:
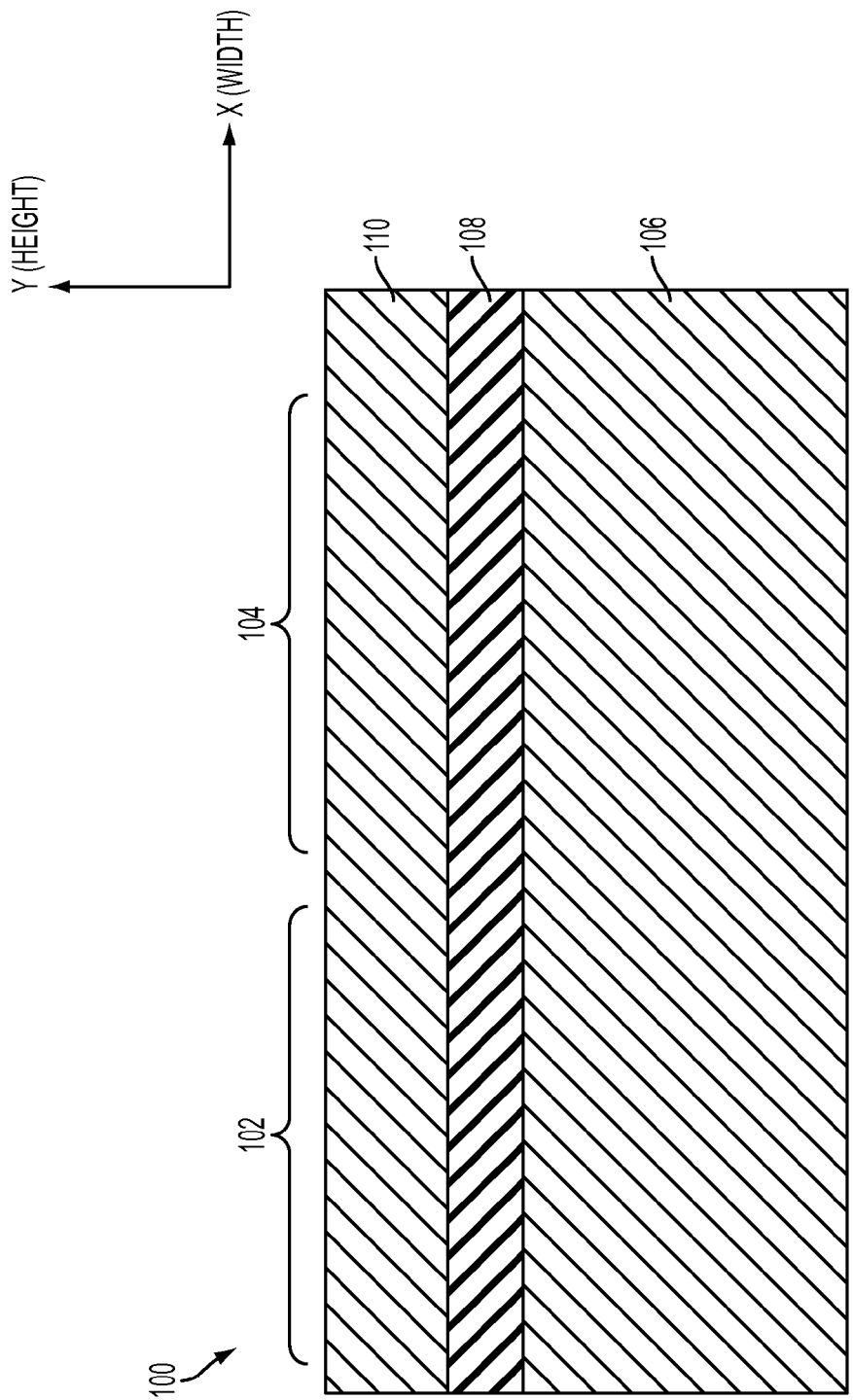

With reference now to FIG. 1, a semiconductor-on-insulator (SOI) starting substrate 100 having one or more nFET regions 102 and one or more pFET regions 104 is generally shown. The SOI substrate 100 extends along a first axis (e.g., an X-axis) to define a width, a second axis (e.g., a Y-axis) to define a height and a third axis (e.g., Z-axis) to define a length. The nFET region 102 and the pFET region 104 form a CMOS device as understood by those ordinarily skilled in the art. It is appreciated that although a SOI substrate 100 is discussed going forward, the starting substrate is formed as a bulk semiconductor substrate. In the case of a bulk substrate, one or more doped wells are formed in regions of the substrate. The regions are doped with n-type atoms to form one or more pFET region, or p-type atoms to form one or more respective n regions as understood by those ordinarily skilled in the art.

The SOI substrate 100 includes a bulk substrate layer 106, an insulator layer 108, and an active semiconductor layer 110. The insulator layer 108 is formed as a buried oxide (BOX) layer 108, for example, that is interposed between the bulk substrate layer 106 and the active semiconductor layer 110 to form the SOI substrate 100 as understood by those ordinarily skilled in the art. The BOX layer 108 is formed from various materials including, but not limited to, silicon dioxide ($SiO_2$). The bulk substrate layer 106 and the active semiconductor layer 110 is formed from various semiconductor materials including, but not limited to silicon (Si).

Figure 2:
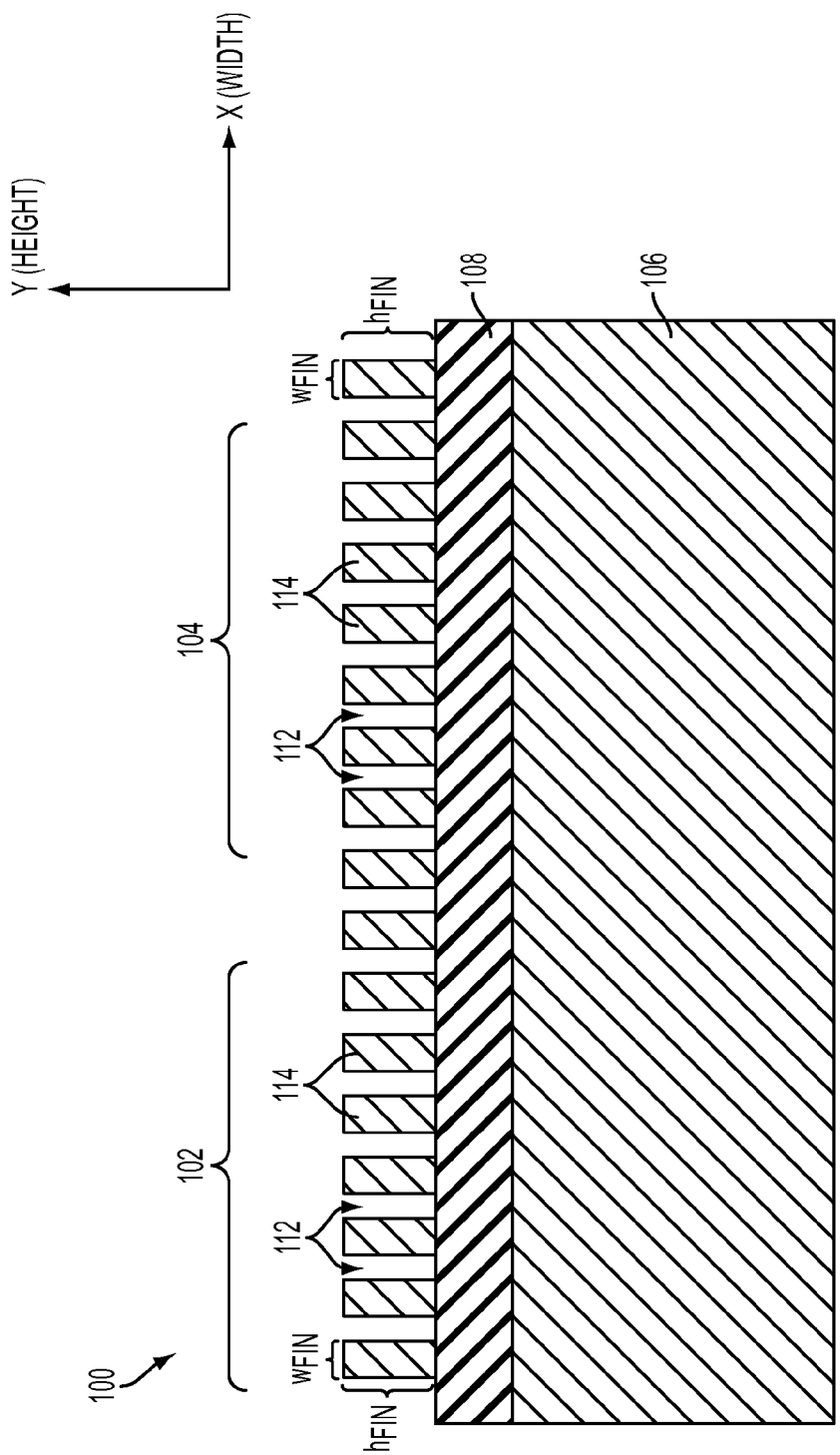

Referring to FIG. 2, the active semiconductor layer 110 is patterned according to a well-known sidewall image transfer (SIT) patterning process, for example. Accordingly, a plurality spaced regions 112 are formed in the active semiconductor layer 110. The spaced regions 112 define a plurality of semiconductor fins 114 that are formed on the BOX layer 108. The plurality of semiconductor fins 114 includes one or more n-type fins 114 formed in the nFET regions 102 and one or more pFET fins 114 formed in the pFET region 104. Each of the fins 114 extends along the X-axis to define a respective first fin width ($w_{FIN}$), and extends from the BOX layer 108 along the Y-axis to define a fin height ($h_{Fin}$).

Figure 3A:
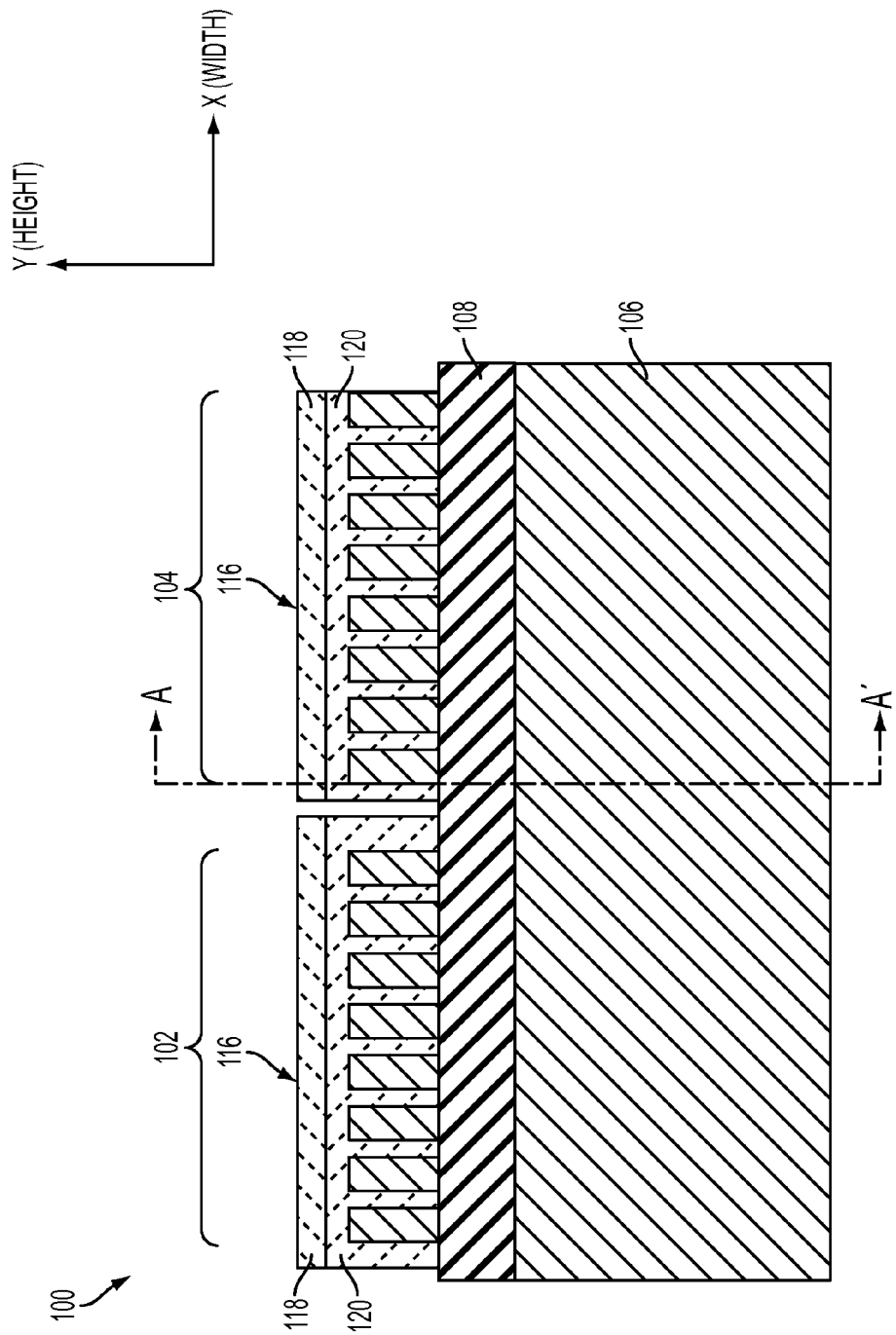
FIG. 3A illustrates the substrate of FIG. 2 following formation of a dummy gate stack that wraps around an outer surface of the semiconductor fins to define a channel region.
Figure 3B:
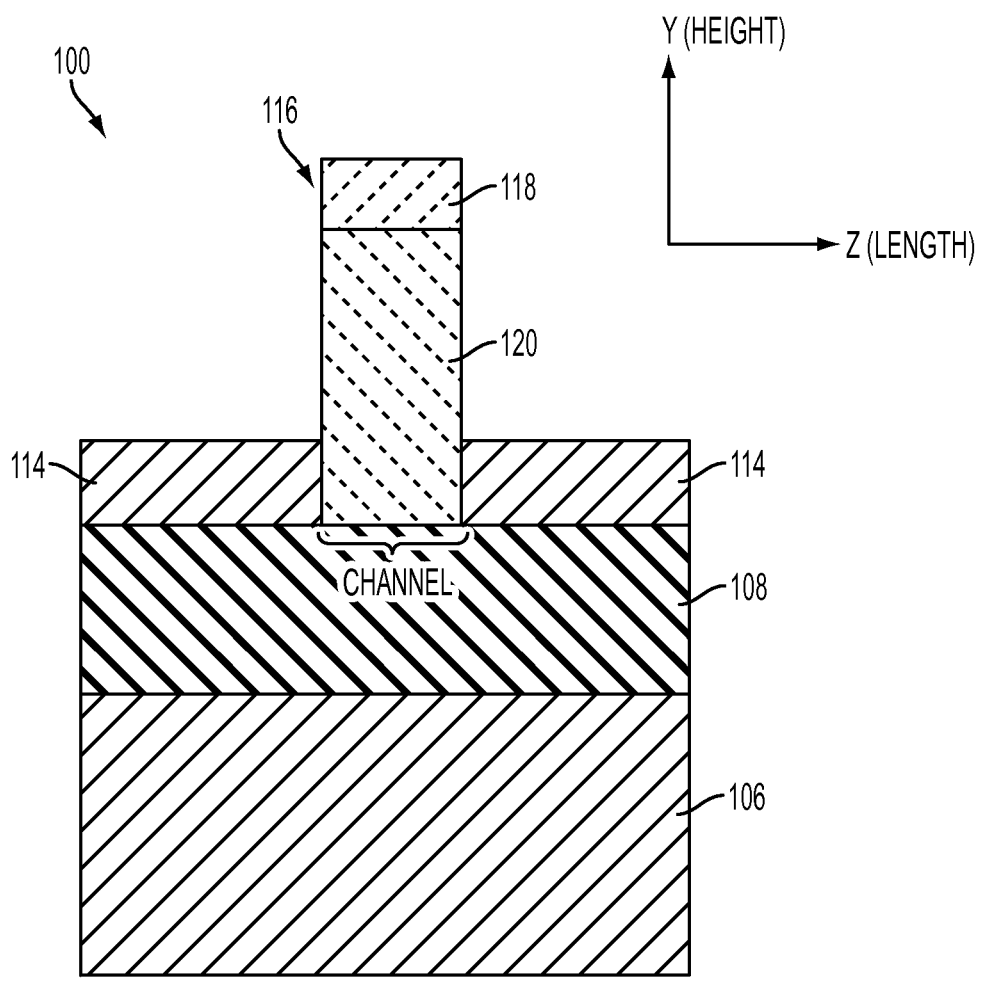
FIG. 3B is a cross-sectional view in a second orientation taken along the lines A-A' of FIG. 3A.

Turning to FIGS. 3A-3B, a dummy gate stack 116 is formed atop the BOX layer 108 and extends along the X-axis using various gate stack formation processes understood by those ordinarily skilled in the art. The dummy gate stack 116 includes a hardmask layer 118 formed atop a dummy gate element 120. The hardmask layer 118 is formed from, for example, silicon nitride (SN) and the dummy gate element 120 is formed from, for example, polysilicon (PC). The dummy gate element 120 wraps around a portion of each semiconductor fin 114 to define a gate channel region that extends along the Z-axis to define a channel length ($l_{CHANNEL}$). The length of gate channel region ultimately defines a respective channel region of the n-type fins 114 (i.e., an nFET channel region) and/or the p-type fins 114 (i.e., a PFET channel region).

Figure 4A:
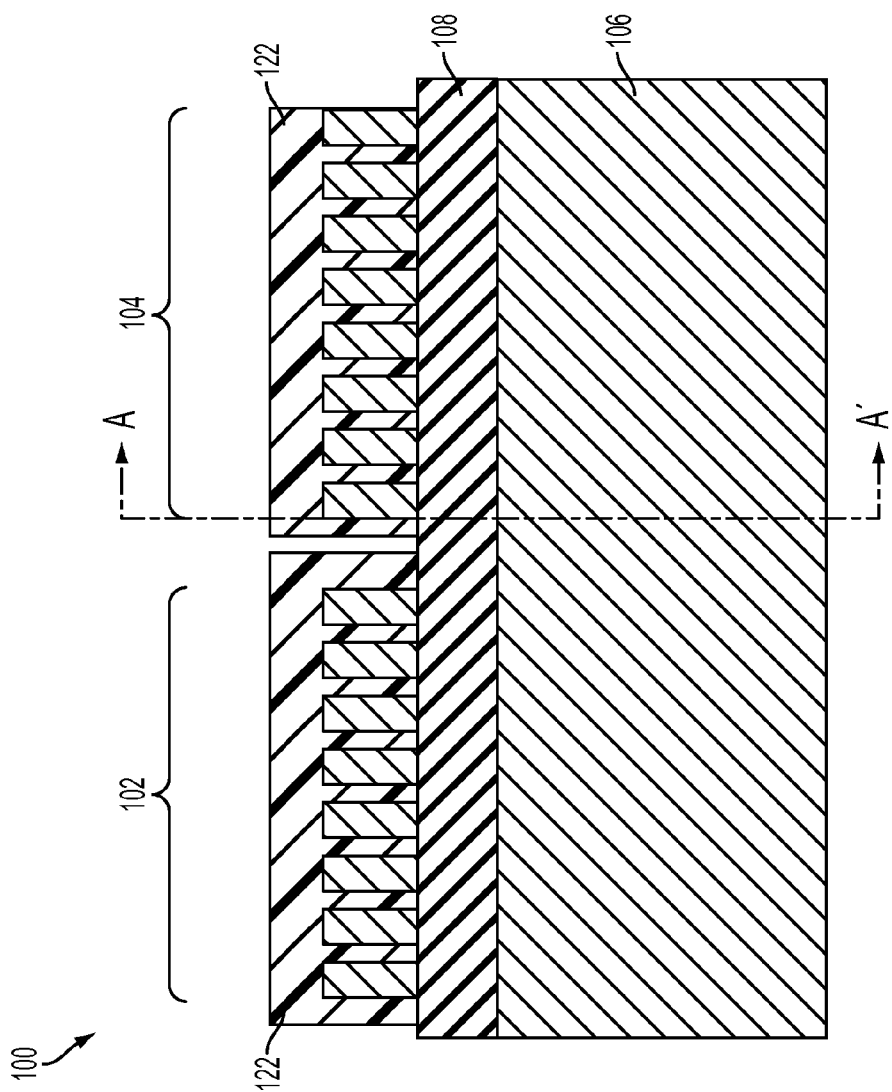
FIG. 4A illustrates the substrate of FIGS. 3A-3B in the first orientation following formation spacers on sidewalls of the dummy gate stack.
Figure 4B:
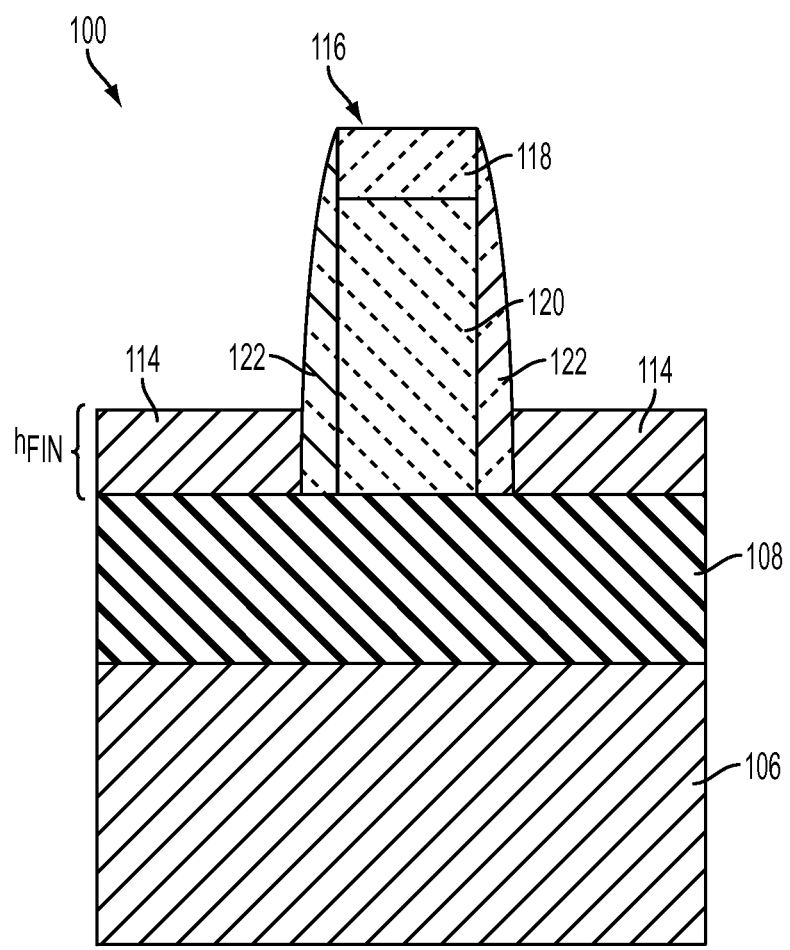
FIG. 4B is a cross-sectional view of the substrate illustrated in FIG. 4A according to the second orientation.

Referring to FIGS. 4A-4B, gate spacers 122 are formed on sidewalls of the dummy gate stack 116. The gate spacers 122 may comprise nitride, and formed via a technique such as deposition of a conformal nitride layer. Sacrificial layers of the conformal nitride layer are removed such that the remaining nitride material forms the gate spacers 122 as understood by those ordinarily skilled in the art. In this regard, the hardmask layer 118 protects the underlying dummy gate element 120 when etching the conformal spacer layer to form the gate spacers 122. The gate spacers 122 are formed from various materials including, but not limited to, SiN.

Figure 5A:
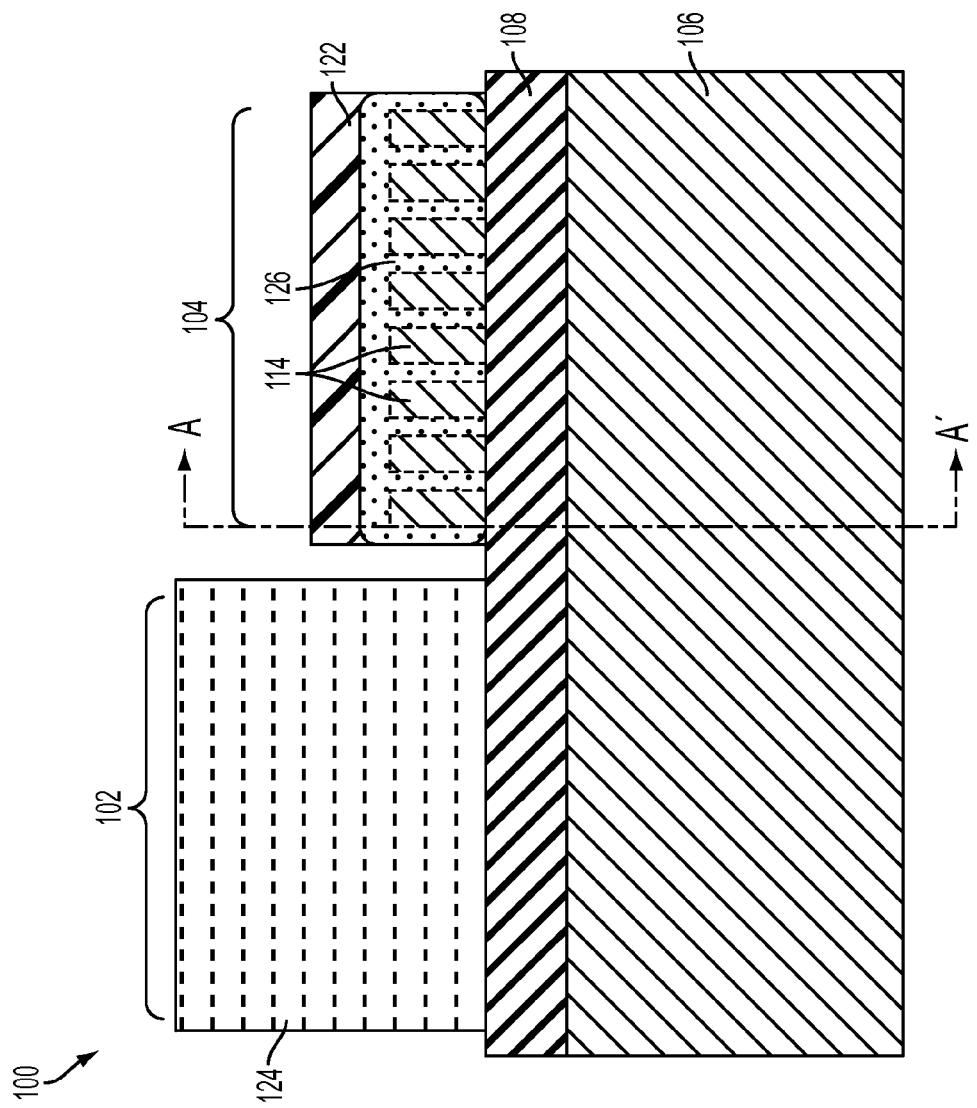
FIG. 5A illustrates the substrate of FIGS. 4A-4B in the first orientation after selectively growing a first epitaxial material on source/drain regions of the semiconductor fins formed in a pFET region of the substrate according to a first embodiment.
Figure 5B:
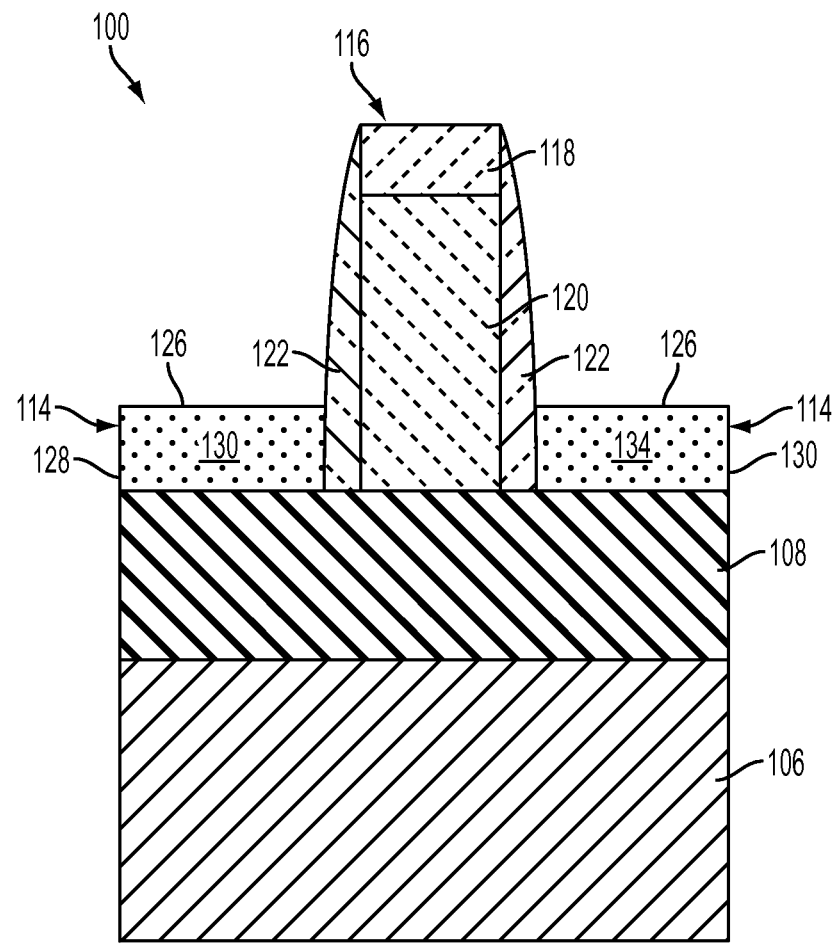
FIG. 5B is a cross-sectional view of the substrate illustrated in FIG. 5A according to the second orientation.

Turning now to FIGS. 5A-5B, a first masking layer 124 is deposited on the BOX layer 108 such that the semiconductor fins 114 and the dummy gate stack 116 in the nFET region 102 and the pFET region 104 are covered. The first masking layer 124 is then selectively patterned to expose the pFET region 104 while covering the nFET region 102. It is appreciated that the first masking layer 124 is instead patterned to expose the nFET region 102 while the pFET region 104 remains covered.

Still referring to FIGS. 5A-5B, a first epitaxial material 126 such as SiGe, for example, is grown on the exposed surfaces of the semiconductor fins 114 formed in the exposed pFET region 104, for example. The first epitaxial material 126 is grown using various epitaxial growth processes understood by those ordinarily skilled in the art. In addition, the first epitaxial material 126 is also in-situ doped with p-type atoms such as boron, for example, as understood by those ordinarily skilled in the art. According to at least one embodiment, the first epitaxial material 126 covers opposing side portions of each semiconductor fin 114 located adjacent to opposing sides of the dummy gate stack 116. The epitaxial material 126 extends between a first end 128 of the fin 114 and a first spacer 122 of a first side of the fin 114 to define a first source/drain (S/D) region 130, and between a second end 132 of the fin 114 and a second spacer 122 of the fin 114 to define a second S/D region 134. In this regard, a middle portion of the fins 114 located beneath the dummy gate element 120 and the gate spacers 122 exclude the epitaxial material 126. The S/D regions corresponding to the semiconductor fins 114 located in the nFET region 102 are referred to as nFET S/D region, and the S/D regions corresponding to the semiconductor fins 114 located in the pFET region 104 are referred to as the pFET S/D region.

Figure 6B:
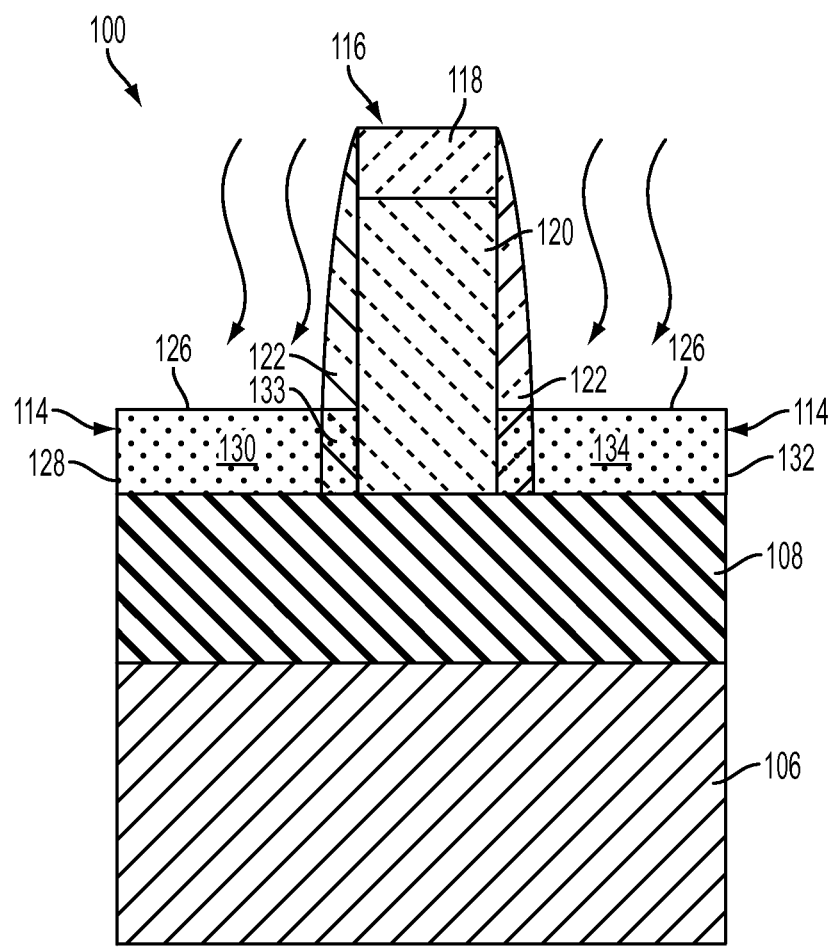
FIG. 6B is a cross-sectional view of the substrate illustrated FIG. 6A according to the second orientation.

Referring to FIGS. 6A-6B, another exemplary embodiment is illustrated where extension regions 133 are formed in portions of the fins 114 that are covered by the gate spacers 122. More specifically, after selectively growing a first epitaxial material 126 on the semiconductor fins 114 formed in a pFET region 104 as described in detail above, the SOI substrate 100 undergoes a high-temperature annealing operation. The temperature ranges, for example, from approximately 900 degrees Celsius to approximately 1300 degrees Celsius. The annealing process diffuses the doped ions of the first epitaxial material 126 into the portions of the fin 114 located beneath the gate spacers 122 to form the extension regions 133 as illustrated in FIG. 6B. It is appreciated that the aforementioned annealing process is not limited to this stage of the process flow.

Figure 7A:
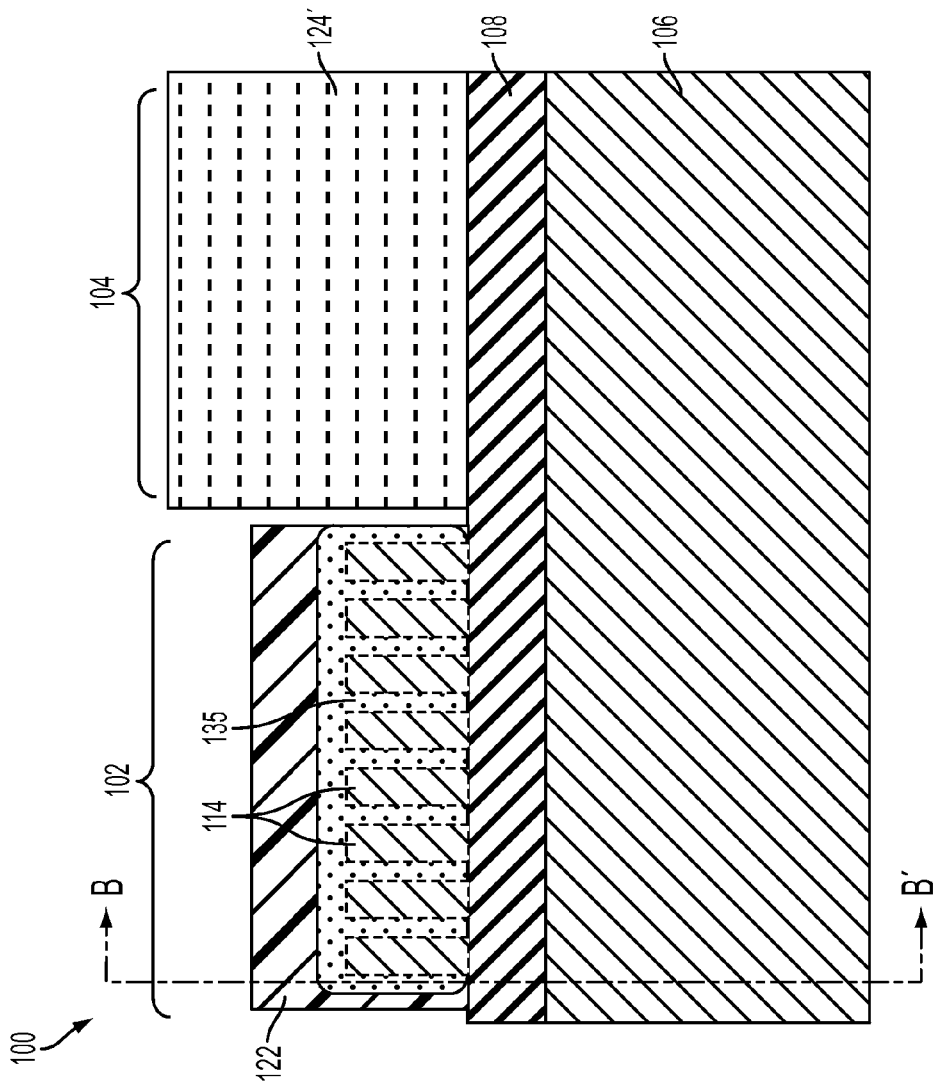
FIG. 7A illustrates the substrate of FIGS. 5A-5B in the first orientation after growing a second epitaxial material on the source/drain regions of the semiconductor fins formed in a nFET region of the substrate.
Figure 7B:
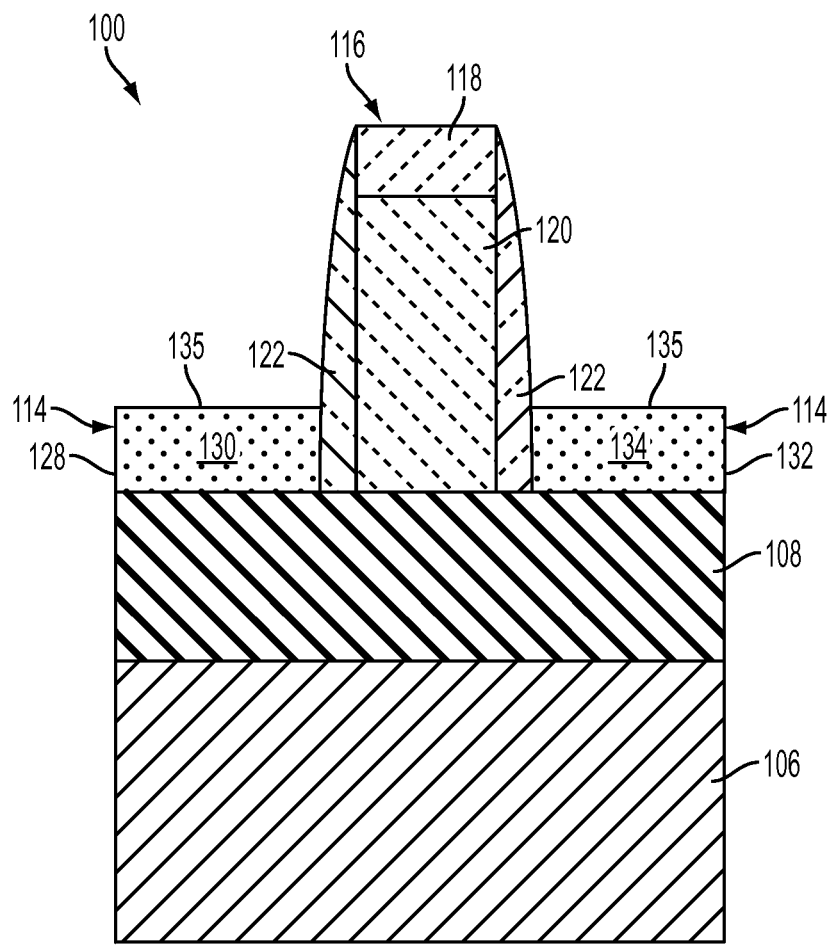
FIG. 7B is a cross-sectional view taken along line B-B' illustrating the substrate of FIG. 7A according to the second orientation.

Referring now to FIGS. 7A-7B, a second masking layer 124' is deposited on the BOX layer 108, which covers the semiconductor fins 114 and the dummy gate stack 116 in the nFET region 102 and the pFET region 104. It is appreciated that the first masking layer 124 is stripped before depositing the second masking layer 124'. The second masking layer 124' is then selectively patterned to expose the nFET region 102 while covering the pFET region 104.

Still referring to FIGS. 7A-7B, a second epitaxial material 135 is grown on the exposed surfaces of the semiconductor fins 114 formed in the exposed nFET region 102, for example. The second epitaxial material 135 is grown using various epitaxial growth processes understood by those ordinarily skilled in the art. In addition, the second epitaxial material 135 such as silicon, for example, is also in-situ doped with n-type atoms such arsenic or phosphorus, for example, as understood by those ordinarily skilled in the art. According to at least one embodiment, the second epitaxial material 135 covers each semiconductor fin 114 and extends between a first end 128 of the fin 114 and a first spacer 122 to define a first S/D region 130, and between a second end 132 of the fin 114 and a second spacer to define a second S/D region 134. In this regard, the portions of the fin 114 located beneath the dummy gate element 120 and the gate spacers 122 exclude the second epitaxial material 135. An optional thermal annealing process is performed to diffuse the dopant atoms of the second epitaxial material 135 into the portions of the fins located beneath the gate spacers 122 to form extension regions as described in detail above with respect to FIGS. 5A-5B.

Figure 8A:
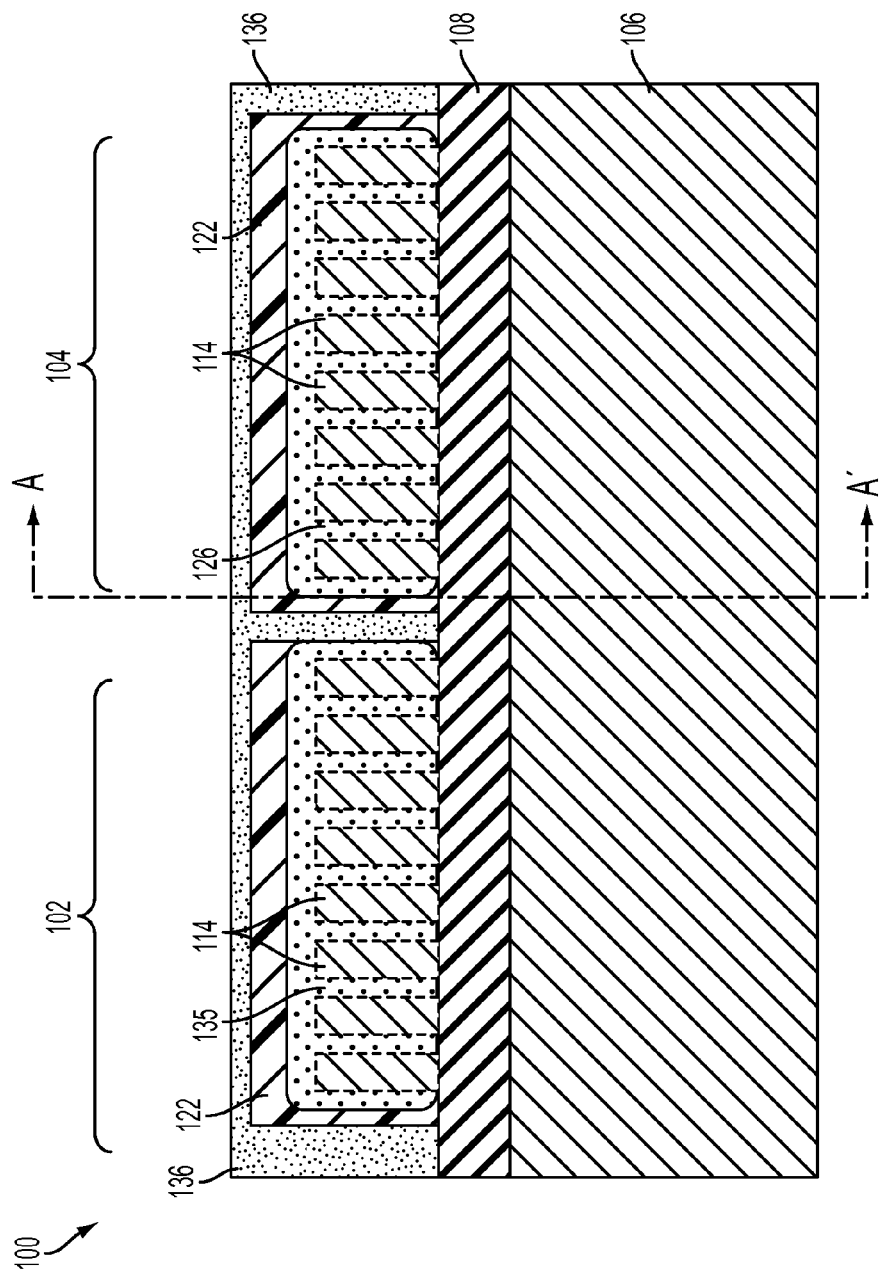
FIG. 8A illustrates the substrate of FIGS. 7A-7B following deposition of a dielectric layer that covers the semiconductor fins and the dummy gate stack in the nFET region and the pFET region.
Figure 8B:
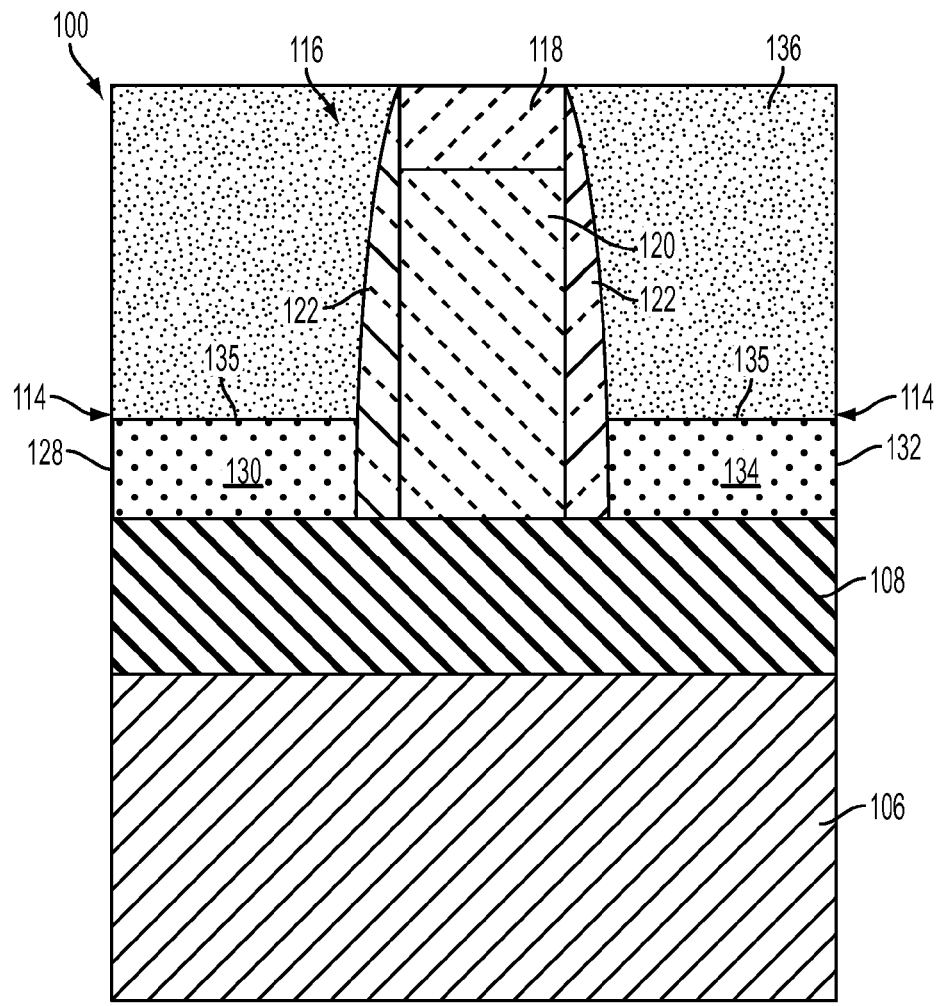
FIG. 8B illustrates the substrate of FIG. 8A according to the second orientation.

Turning to FIGS. 8A-8B, the first and/or second masking layers 124/124' are stripped away, and a dielectric layer 136 is deposited on the BOX layer 108 such that the S/D regions of the fins 114 and the gate stack 116 in both the nFET region 102 and the pFET region 104 are covered. The dielectric layer 136 is formed from various materials including, but not limited to, $SiO_2$. The dielectric layer 136 is planarized according to a chemical-mechanical planarization (CMP) process as understood by those ordinarily skilled in the art. Accordingly, the upper surface of the hardmask layer 118 is formed flush with the upper surface of the dielectric layer 136 as further illustrated in FIG. 8B.

Figure 9A:
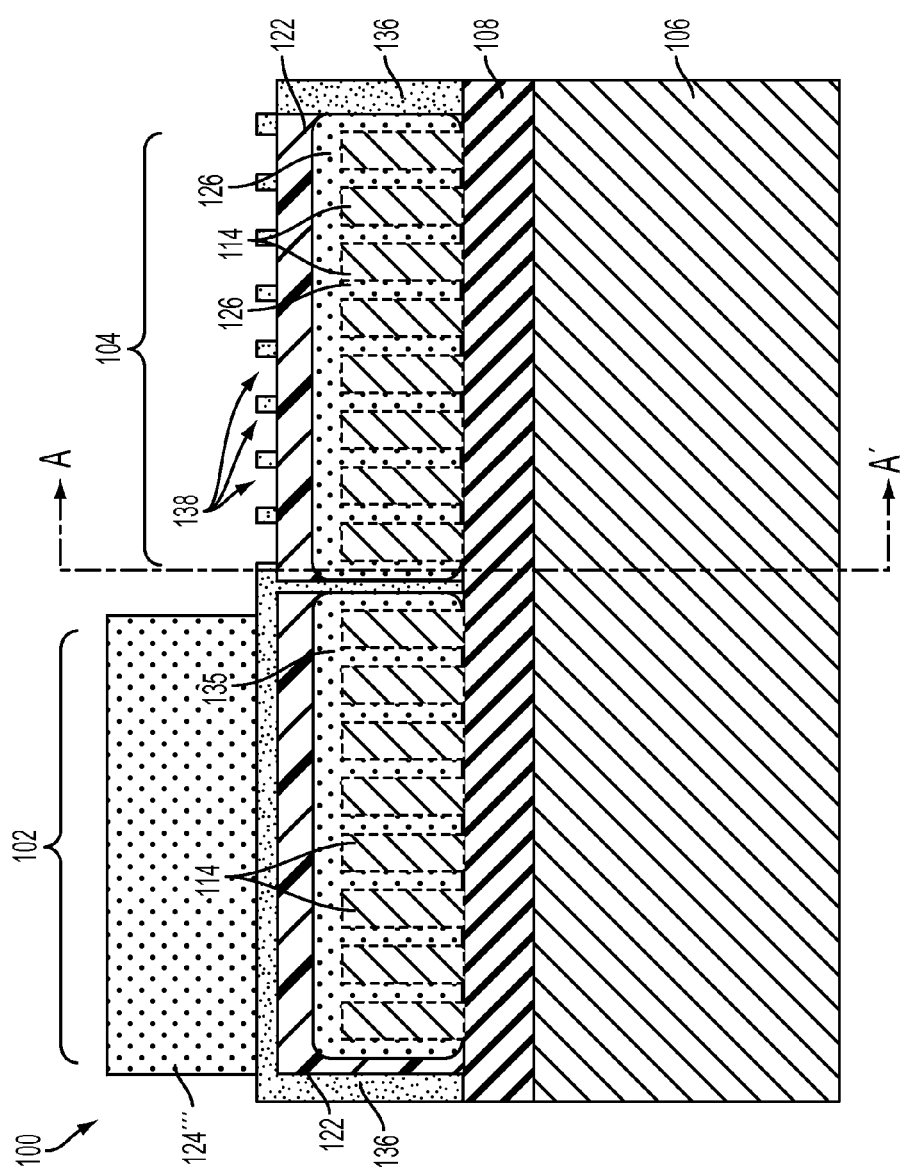
FIG. 9A illustrates the substrate of FIGS. 8A-8B following a replacement metal gate process that removes the dummy gate stack and exposes a portion of the semiconductor fins in the channel region of the pFET region.
Figure 9B:
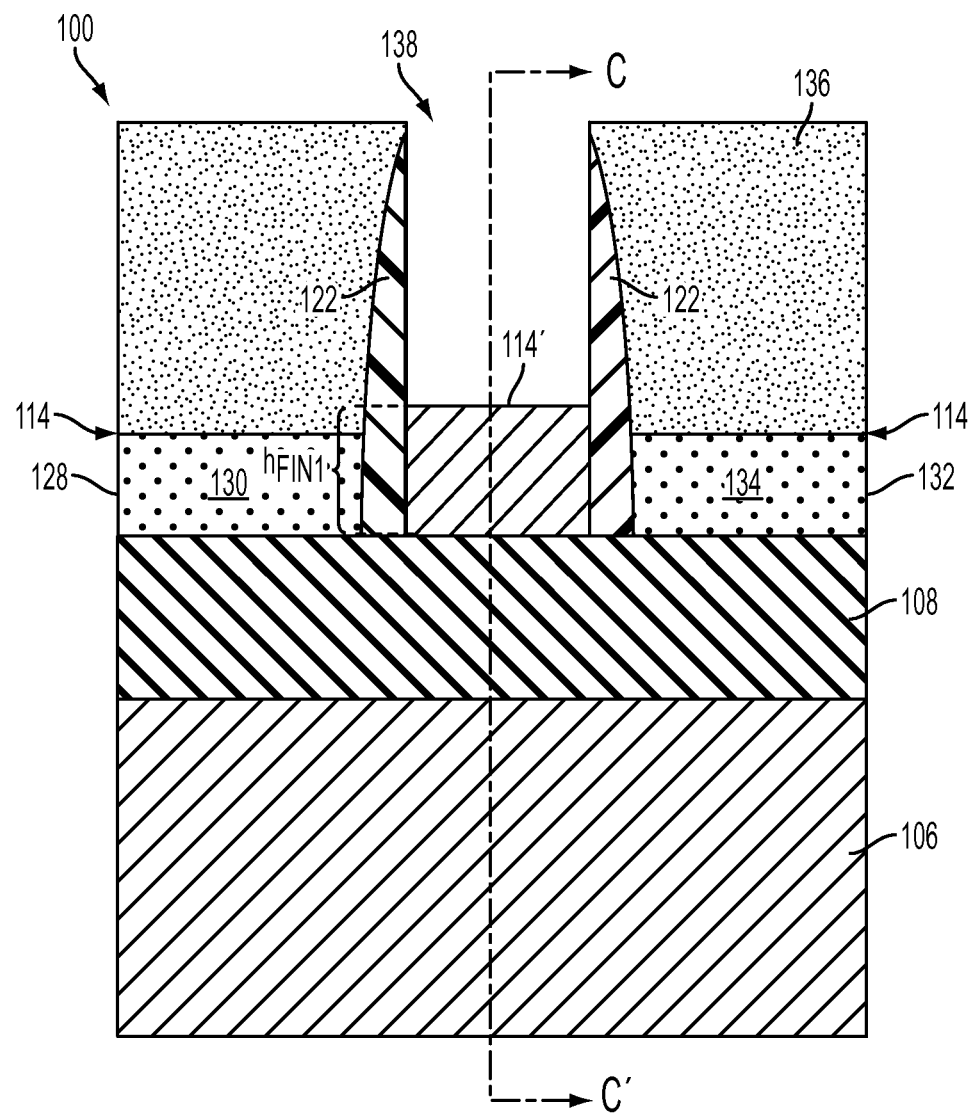
FIG. 9B illustrates the substrate of FIG. 9A according to the second orientation.
Figure 9C:
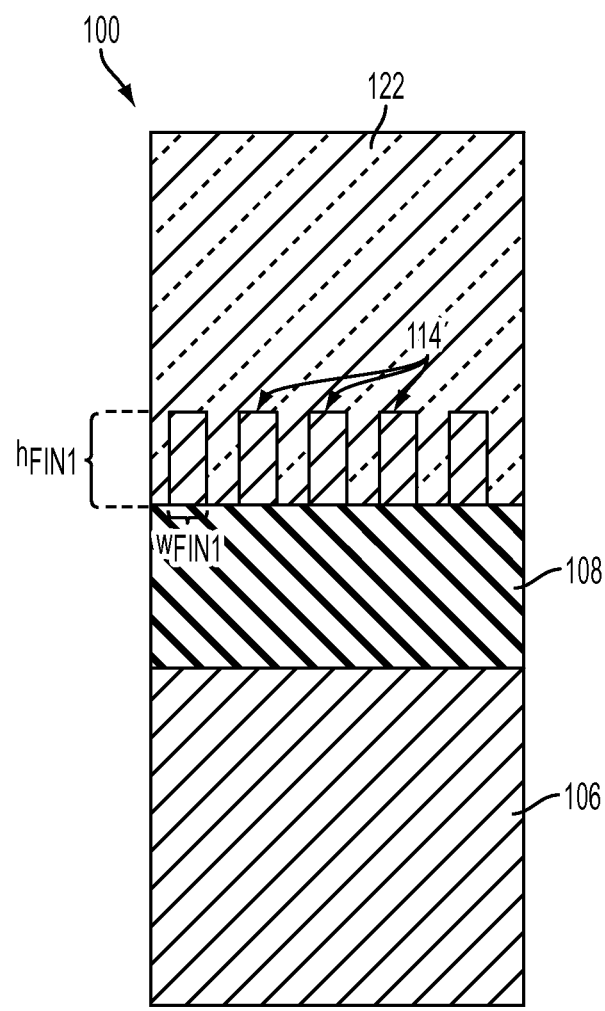
FIG. 9C is a third orientation of the substrate shown in FIGS. 9A-9B illustrating a cross-section of the semiconductor fins taken along line C-C'.

Referring to FIGS. 9A-9C, a third masking layer 124''' is deposited on the dielectric layer 136. The third masking layer 124''' is then selectively patterned to expose the pFET region 104 while covering the nFET region 102. It is appreciated that the masking layer 124''' is instead patterned to expose the nFET region 102 while the pFET region 104 remains covered.

After exposing the pFET region 102, for example, the hardmask layer 118 is etched away and the dummy gate element 120 is removed from the gate stack 116 according to a replacement metal gate (RMG) process as understood by those ordinarily skilled in the art. Accordingly, a gate opening 138 is formed in each gate stack 116 that exposes the middle portion 114' of a respective semiconductor fin 114 (i.e., an exposed fin portion 114'). The exposed fin portions 114' exclude the first epitaxial material 126 or the second epitaxial material 135 since this portion was covered by the dummy gate element 120 during the epitaxial growth processes described above. As illustrated in FIG. 9C, each exposed fin portion 114' has an initial fin width ($w_{FIN1}$) and an initial fin height ($h_{FIN1}$).

Figure 10A:
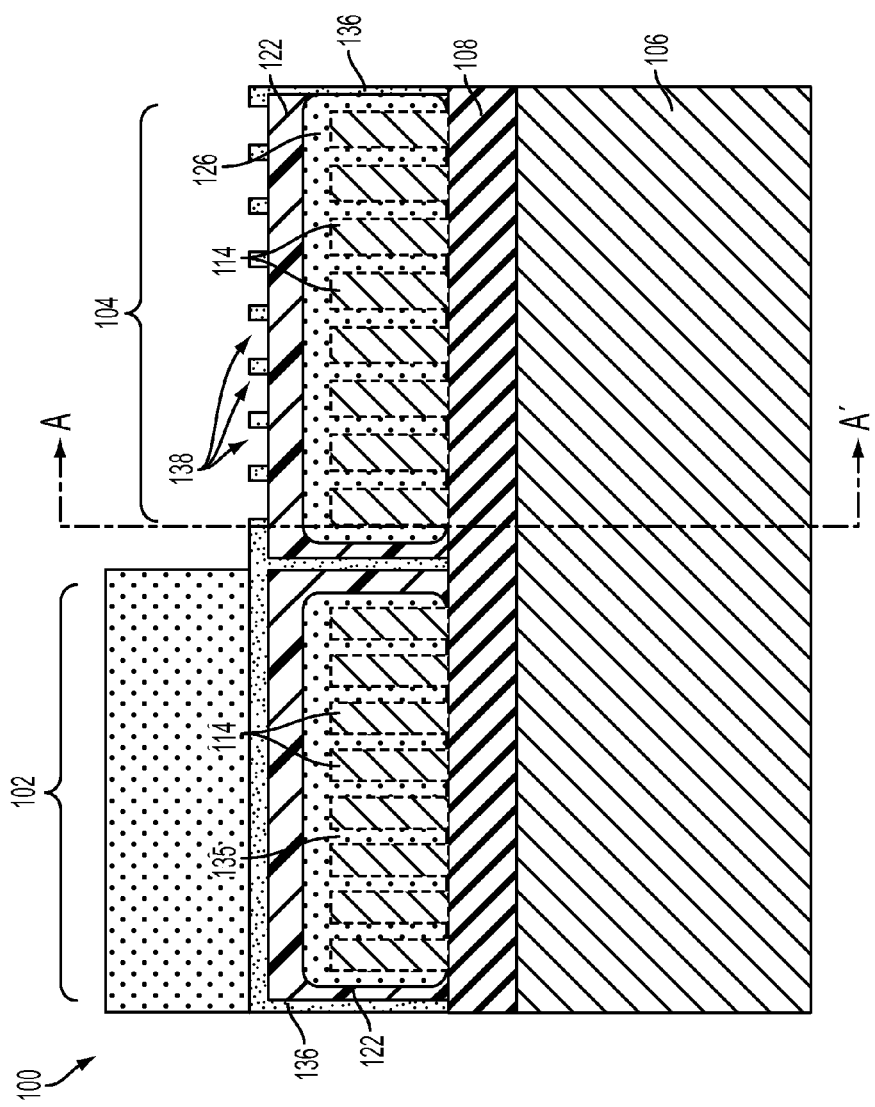
FIG. 10A illustrates the substrate of FIGS. 9A-9C after partially etching the exposed portion of the semiconductor fins in the channel region.
Figure 10B:
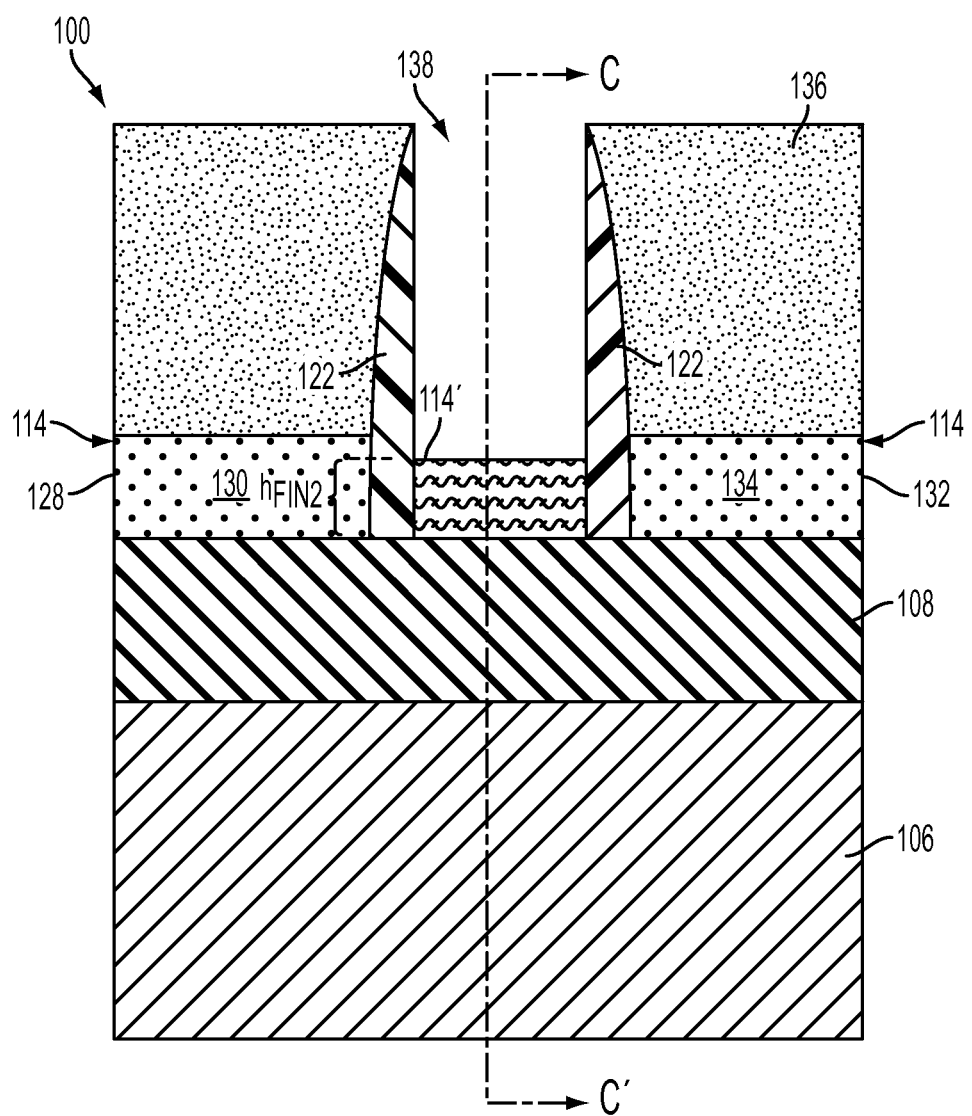
FIG. 10B illustrates the substrate of FIG. 10A according to the second orientation.
Figure 10C:
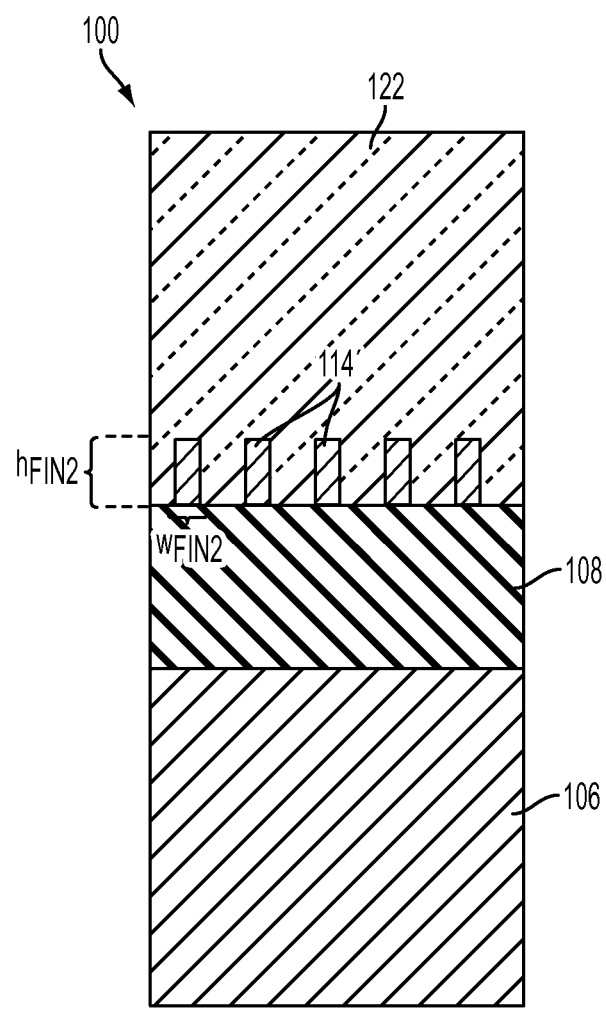
FIG. 10C illustrates the cross-section of the semiconductor fins shown in FIGS. 10A-10B according to the third orientation.

Turning now FIGS. 10A-10C, the exposed fin portions 114' are selectively etched with respect to the BOX layer 108, the gate spacers 122, and the dielectric layer 136. According to at least one exemplary embodiment, a selective dry etching process is used, for example, to etch the exposed fin portions 114'. For example, the BOX layer 108, the gate spacers 122 and the dielectric layer 136 is formed from an oxide material, and a hydrochloric (HCl) gas, which is selective to oxide materials, is applied to the exposed fin portions 114'. According to at least one exemplary embodiment, each side of the exposed fin portions 114' is etched to reduce the width and/or height of the exposed fin portions 114'. In this regard, a new fin width ($w_{FIN2}$) and new fin height ($h_{FIN2}$) is formed as illustrated in FIG. 10C. The surfaces of the exposed fin portions 114' are reduced, for example, by approximately 2 nanometers (nm) to approximately 3 nm.

Figure 11A:
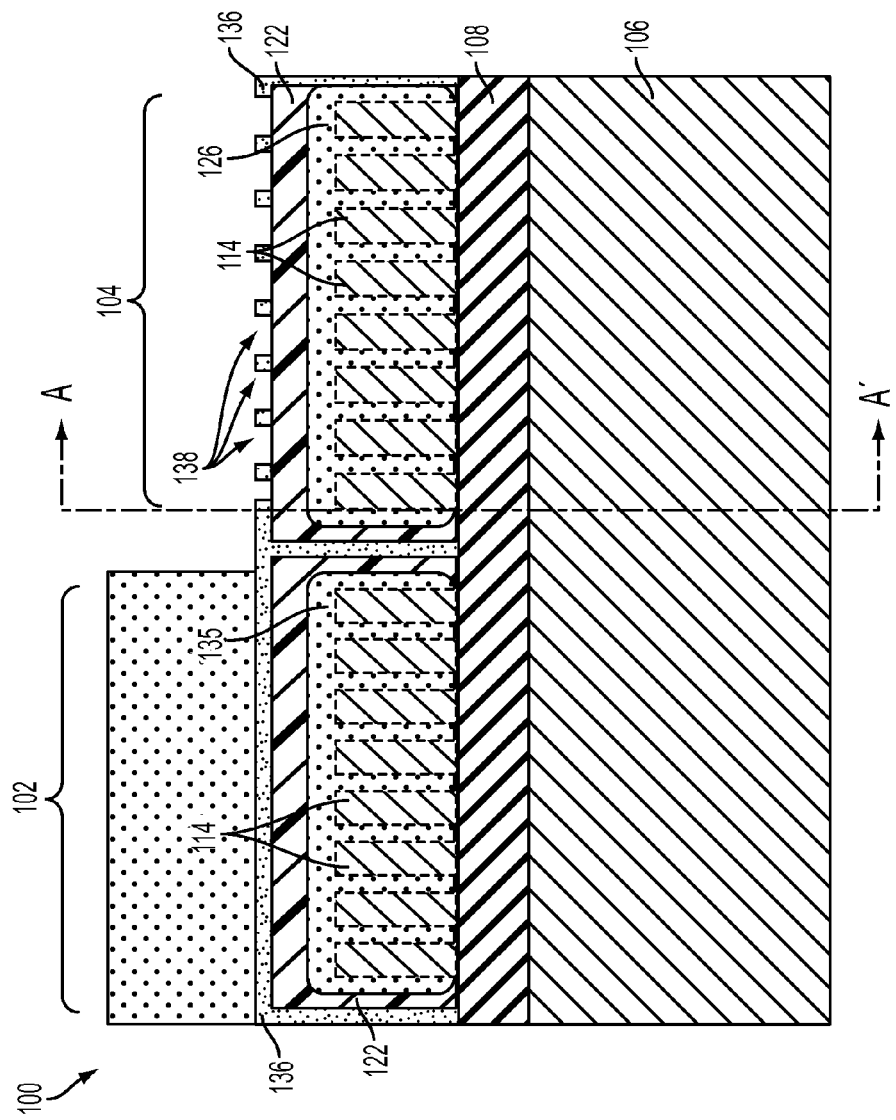
FIG. 11A illustrates the substrate of FIGS. 10A-10C in the first orientation after growing an epitaxial liner on the exposed portion of the semiconductor fins in the channel region to form an epi-lined channel region in the pFET region.
Figure 11B:
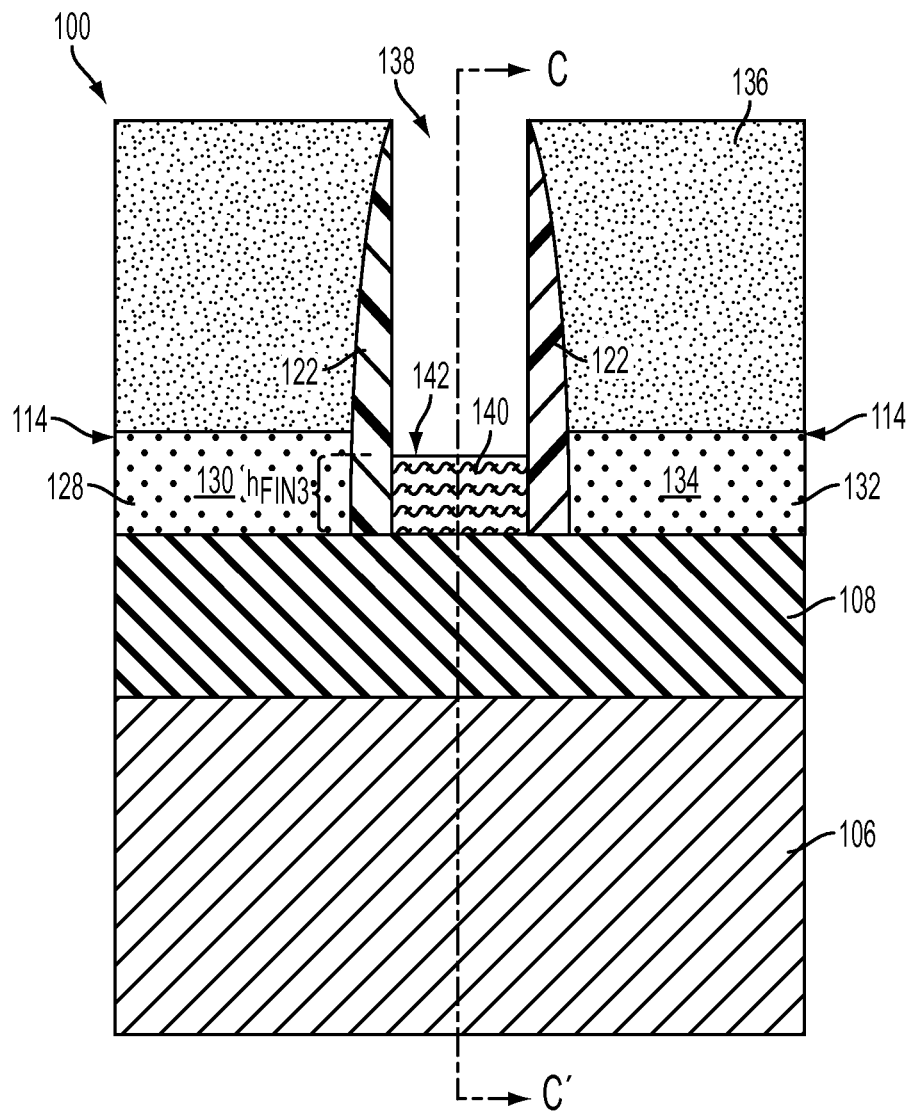
FIG. 11B illustrates the substrate of FIG. 11A according to the second orientation.
Figure 11C:
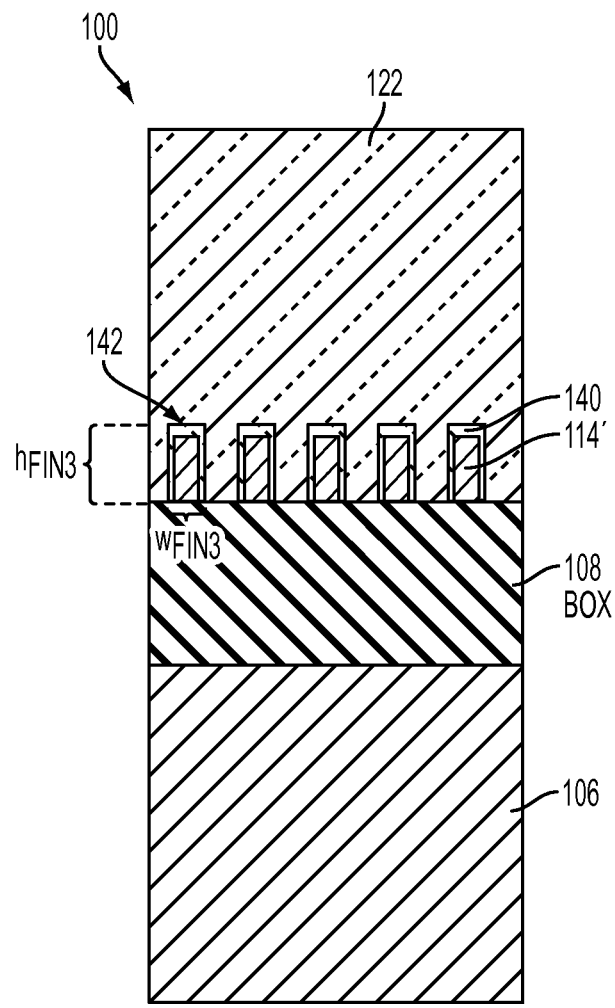
FIG. 11C illustrates the cross-section of the semiconductor fins shown in FIGS. 11A-11B according to the third orientation.

Referring now to FIGS. 11A-11C, an epitaxial liner 140 is grown on the etched surfaces of one or more of the exposed fin portions 114'. The combination of the epitaxial liner 140 and the underlying fins increases electron hole-mobility through the channel region of the fin portions 114'. The epitaxial liner 140 is formed, for example, by epitaxially growing silicon germanium (SiGe) on the etched surfaces of the exposed fin portions 114'. The germanium (Ge) concentration in the SiGe can range from approximately 10% to approximately 99%, for example. According to at least one embodiment, the germanium (Ge) concentration in the SiGe is range from 20% to 90%.

The width of the epitaxial liner 140 equals or is approximately equal to the amount of material previously etched away from the surfaces of the exposed fin portions 114'. In this regard, combination of the etched exposed fin portions 114' and the epitaxial liner 140 defines a combined fin width ($w_{FIN3}$) that is equal to or approximately equal to the initial fin width ($w_{FIN1}$), and a combined fin height ($h_{FIN3}$) that is equal to or approximately equal to the initial fin height ($h_{FIN}$) (see FIGS. 11B-11C).

The combination of the epitaxial liner 140 and a respective etched exposed fin portion 114' forms an epitaxial-lined channel region 142 that modulates the threshold voltage (Vt) of the respective fin 114. For example, the epitaxial-lined channel region 142 is formed having a Vt of approximately −0.3 V for approximately 25% SiGe, and approximately −0.4 V for approximately 50% SiGe. According to at least one embodiment, the epitaxial-lined channel region 142 (i.e., a SiGe liner formed on an etched portion of the semiconductor fin) is formed in only the pFET region 104. The channel regions of the nFET region, however, consist only of Si. That is, the nFET region excludes the SiGe liner from etched portions of the semiconductor fin (e.g., the middle portion of the fin). In this regard, the pFET region 104 is formed having a first Vt and the nFET region 102 is formed having a different second Vt.

According to another embodiment, the substrate may have multiple pFET regions. Each pFET region has a different concentration of SiGe with respect to one another. For example, a first pFET may include a first epitaxial liner 140 having a 75% concentration of SiGe, a second pFET may include a second epitaxial liner 140 having a 50% concentration of SiGe, a third pFET region may include a third epitaxial liner 140 having a 25% concentration of SiGe, and a fourth pFET region may exclude a SiGe liner 140 (i.e., 0% concentration of SiGe). Accordingly, each pFET has a different Vt with respect to one another.

Figure 12:
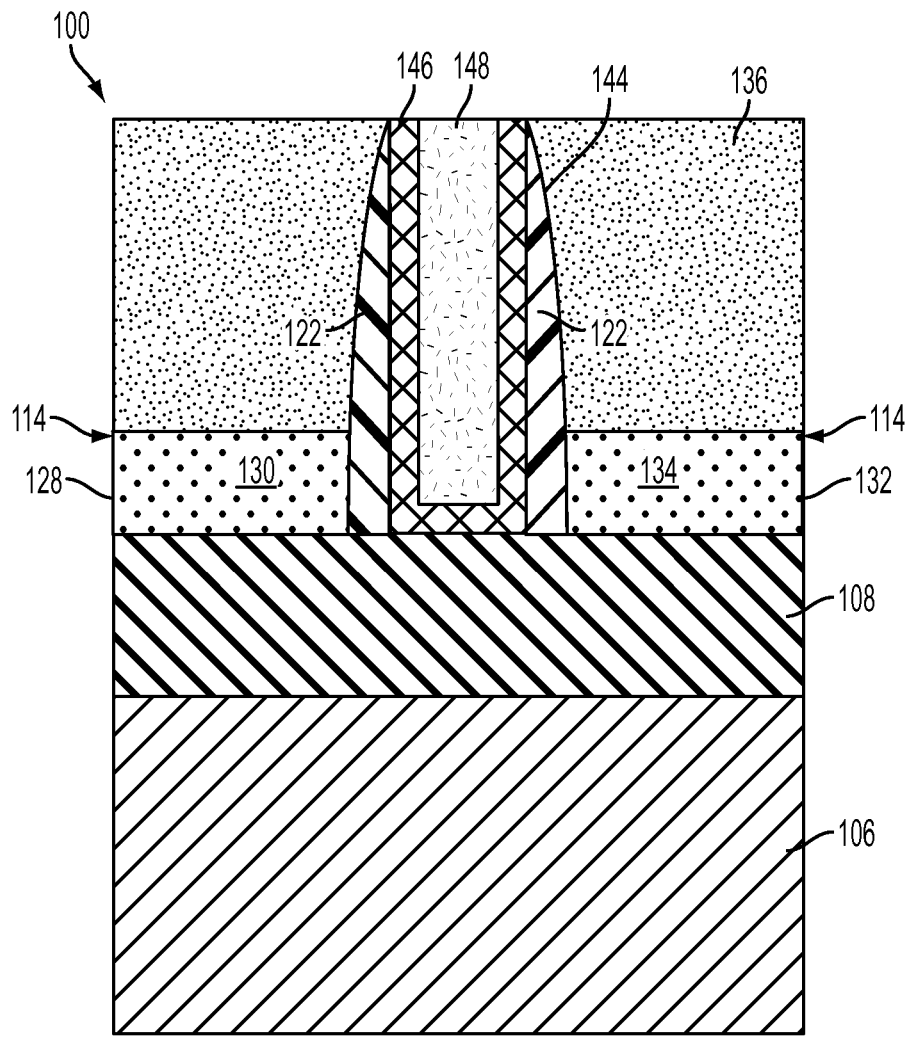

Turning now to FIG. 12, a metal gate stack 144 that wraps around the epitaxial-lined channel region 142 is formed in the gate opening 138. The metal gate stack 144 includes a gate dielectric layer 146 and a metal gate element 148. The gate dielectric layer 146 is formed by depositing a conformal dielectric layer on the sidewalls of the gate spacers 122 and on the surfaces of the epitaxial-lined channel region 142. The gate dielectric layer 146 is formed from various materials including, but not limited to, an oxide, nitride, and/or oxynitride material. In one example, the gate dielectric layer 146 is formed from a high k material having a dielectric constant greater than silicon dioxide. Exemplary high-k dielectrics include, but are not limited to, $HfO_2$, $ZrO_2$, $La_2O_3$, $Al_2O_3TiO_2$, $SrTiO_2$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x ranges from 0.5 to 3, for example, and each value of y ranges from 0 to 2, for example. In some embodiments, the gate dielectric layer 146 is formed as a multilayered gate dielectric structure comprising different gate dielectric materials, including but not limited to, silicon dioxide, and a high-k gate dielectric material.

Thereafter, the remaining gate opening 138 is filled with a metal material to form the metal gate element 148. Any residual metal material and/or high-k material formed on an upper surface of the gate spacers 122 and/or dielectric layer 136 are planarized using a CMP process such that the metal gate stack 144 is formed and the high-k layer 146 interposed between the gate spacers 122 and the metal gate element 148. Although not illustrated, it is appreciated that the metal gate stack 144 also includes one or more work function metal (WFM) layers to further adjust the threshold voltage as understood by those ordinarily skilled in the art.

Figure 13:
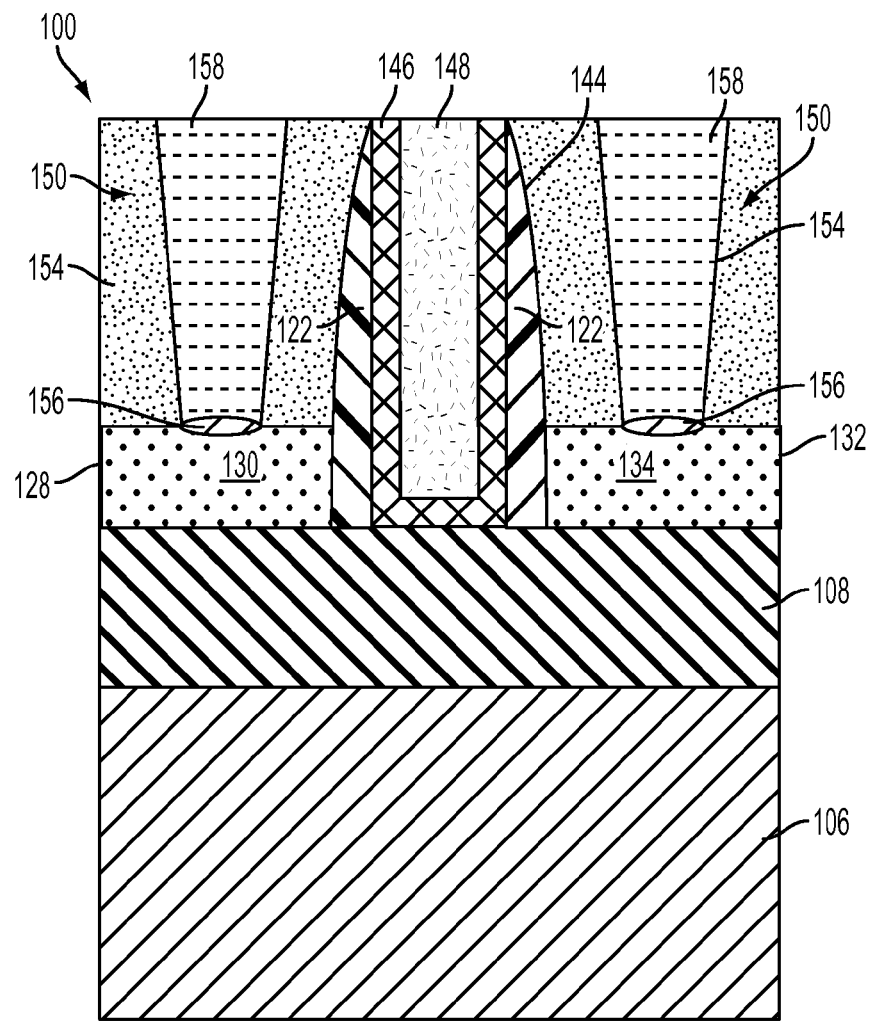

Referring to FIG. 13, an electrically conductive contact structure 150 is formed at each S/D region 130, 134 of the pFET region 104. Each contact structure 150 includes a silicide portion 152 and an electrically conductive via 154. The silicide portion 152 is embedded in the dielectric layer 136 and is formed on the first epitaxial material 126. Various materials are used to form the silicide portion 152 including, but not limited to, $CoSi_2$ and NiSi. The via 154 is formed through the dielectric layer 136 such that a first end 156 contacts the silicide portion 152 and an opposite end 158 is exposed at an upper surface of the dielectric layer 136. Various electrically conductive materials are used to form the vias 154 as understood by those ordinarily skilled in the art. Although formation of conductive contact structure 150 in the pFET region is shown, it appreciated that a conductive contact structure 150 is formed in the nFET region in a similar manner as described above.

Figure 14:
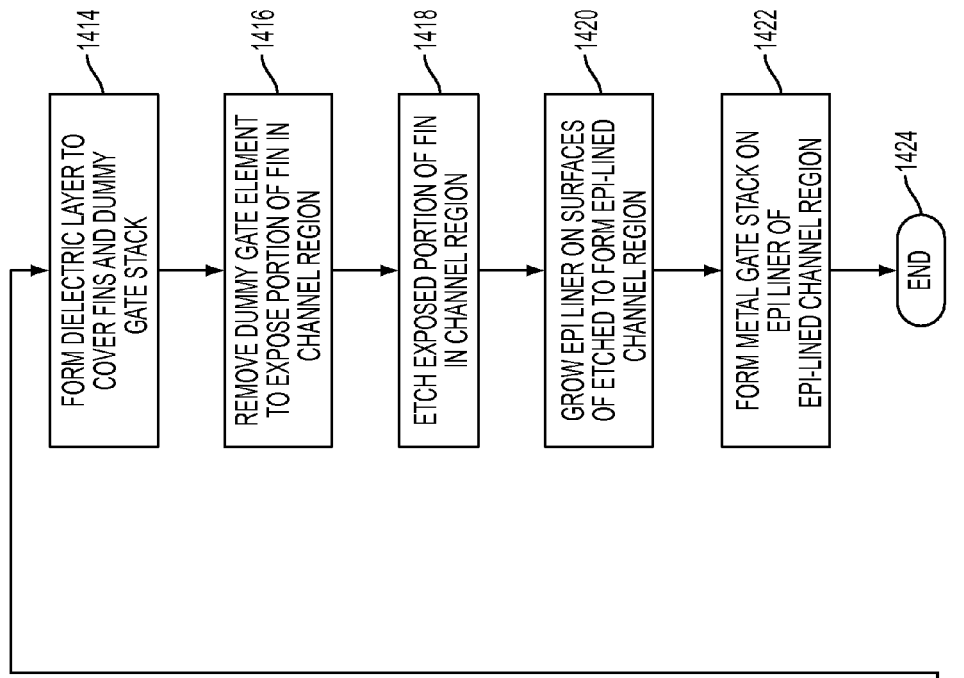
Figure 14:
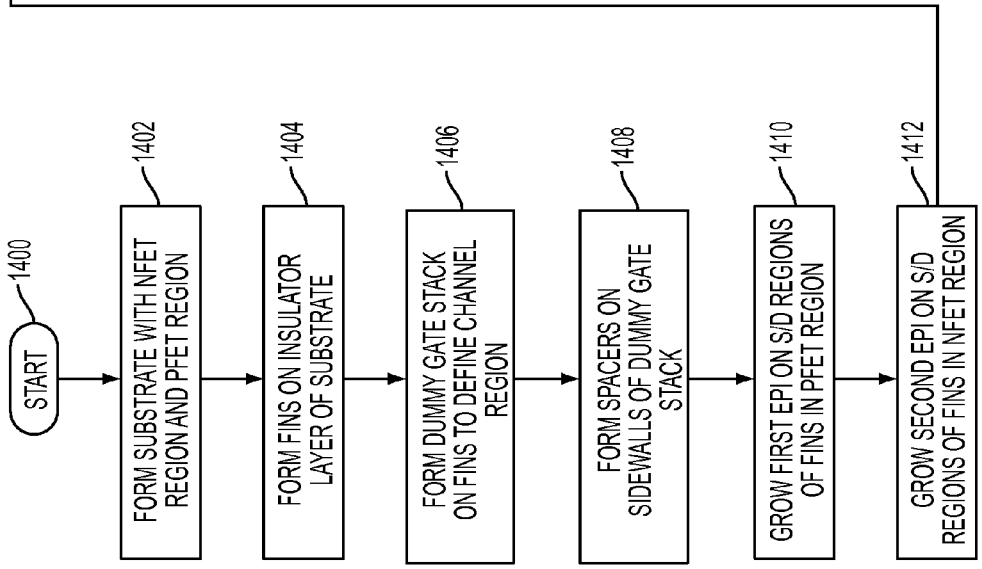

Referring now to FIG. 14, a flow diagram illustrates a method of fabricating a semiconductor device including an epitaxial-lined channel region that adjusts a threshold voltage according to an exemplary embodiment. The method begins at operation 1400, and at operation 1402 a semiconductor substrate including an nFET region and a pFET region is formed. At operation 1404, a plurality of semiconductor fins is formed on an insulator layer of the semiconductor substrate. At operation 1406, a dummy gate stack that wraps around a portion of the fins is formed on the insulator layer. At operation 1408, spacers are formed on sidewalls of the dummy gate stack. At operation 1410, a first epitaxial material is grown at S/D regions of the semiconductor fins formed in the pFET region. At operation 1412, a second epitaxial material is grown at S/D regions of the semiconductor fins formed in the nFET region. A dielectric layer is formed on the insulator layer that covers the semiconductor fins and the dummy gate stack in the nFET and pFET regions at operation 1414. At operation 1416, a dummy gate element of the dummy gate stack is removed to form a gate opening that exposes a portion of the semiconductor fin. The exposed portion of the semiconductor fin is etched at operation 1418. At operation 1420, an epitaxial liner is grown on the etched portion of the semiconductor fin to form an epitaxial-lined channel region. At operation 1422, a metal gate stack is formed that wraps around the epitaxial liner of the epitaxial-lined channel region, and the method ends at operation 1424.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the following claims. These claims should be construed to maintain the proper protection for the invention first described.

What is claimed is:

1. A method of forming a semiconductor device, the method comprising:
   forming at least one first semiconductor fin on an nFET portion of a semiconductor substrate, the at least one first semiconductor fin having an nFET channel region interposed between a pair of nFET source/drain regions;
   forming at least one second semiconductor fin on a pFET portion of the semiconductor substrate, the at least one second semiconductor fin having a pFET channel region interposed between a pair of pFET source/drain regions;
   forming a gate stack on the nFET channel region and the pFET channel region;
   forming an epitaxial liner on only the pFET channel region of the at least one second semiconductor fin such that a first threshold voltage of the nFET channel region is different than a second threshold voltage of the pFET channel region, wherein the forming an epitaxial liner comprises:
   removing a dummy gate element from the gate stack formed on the pFET channel region to expose the pFET channel region of at least one second semiconductor fin;

etching the exposed pFET channel region to form an etched pFET channel portion, the etched pFET channel portion having a first thickness that is less than a second thickness of the at least one first semiconductor fin; and epitaxial growing silicon germanium (SiGe) on the etched pFET channel portion, wherein a combination of the etched pFET channel portion and the epitaxial liner defines a third thickness that is equal to the second thickness of the at least one first semiconductor fin.

2. The method of claim 1, wherein the forming an epitaxial liner further comprises:

forming, prior to growing the SiGe, a masking layer that covers the at least one first semiconductor fin and the gate stack formed on the nFET channel region and exposing the at least one second semiconductor fin and the gate stack formed on the pFET channel region.

3. The method of claim 2, further comprising forming silicon germanium (SiGe) in a middle portion of the at least one semiconductor fin formed on the pFET portion, and maintaining only Si in the middle region of that at least one semiconductor fin formed on the nFET portion.

4. The method of claim 3, wherein the pFET portion includes at least one semiconductor fin having a middle portion defined by the SiGe channel region and side portions consisting of Si formed at opposing sides of the middle portion, and wherein the nFET portion includes semiconductor fins having a middle portion consisting of only Si and side portions consisting of Si formed at opposing sides of the middle portion.

5. The method of claim 4, wherein the second threshold voltage is less than the first threshold voltage.

6. The method of claim 5, wherein the semiconductor substrate has multiple pFET regions, each pFET channel region having a different concentration of SiGe with respect to one another to form different respective threshold voltages.

7. The method of claim 6, wherein the multiple pFET regions includes the first pFET region having a SiGe concentration of 25%, the second pFET region having a SiGe concentration of 50%, and a third pFET region having a SiGe concentration of 75%, wherein a third threshold voltage of the third pFET region is less than the first and second threshold voltages.

8. A method of controlling a voltage threshold of a semiconductor device, the method comprising:

forming an nFET region on a semiconductor substrate, and at least one first semiconductor fin on the nFET region, the at least one first semiconductor fin having an nFET channel region interposed between a pair of nFET source/drain regions;

forming a plurality of pFET regions on the semiconductor substrate, and forming a second semiconductor fin on each pFET region, the second semiconductor fin having a pFET channel region interposed between a pair of pFET source/drain regions;

forming a gate stack on the nFET channel region and the pFET channel region; and forming a plurality of epitaxial liners having different doping concentrations with respect to one another, each epitaxial liner formed in a respective pFET region such that a first threshold voltage of the nFET channel region is different than a second threshold voltage of the pFET channel region of a respective second semiconductor fin, wherein the forming an epitaxial liner comprises:

removing a dummy gate element from the gate stack formed on the pFET channel region to expose the pFET channel region of at least one second semiconductor fin;

etching the exposed pFET channel region to form an etched pFET channel portion, the etched pFET channel portion having a first thickness that is less than a second thickness of the at least one first semiconductor fin; and epitaxial growing silicon germanium (SiGe) on the etched pFET channel portion, wherein a combination of the etched pFET channel portion and the epitaxial liner defines a third thickness that is equal to the second thickness of the at least one first semiconductor fin.

9. The method of claim 8, wherein the epitaxial liners have different concentrations of SiGe to define the different first and second threshold voltages.

10. The method of claim 9, further comprising forming a first pFET including a first epitaxial liner having a first concentration of SiGe, and forming a second pFET including a second epitaxial liner having a second concentration of SiGe that is less than the first concentration.

11. The method of claim 10, wherein the first epitaxial liner has a 75% concentration of SiGe, and the second epitaxial liner has a 50% concentration of SiGe.

12. The method of claim 11, further comprising forming a third pFET region including a third epitaxial liner having a 25% concentration of SiGe, and a fourth pFET region that excludes a SiGe liner.

13. The method of claim 12, wherein each of the first pFET region, the second pFET region, the third pFET region, and the fourth pFET region have a different voltage threshold with respect to one another.

* * * * *